(12) United States Patent
Zhang et al.

(10) Patent No.: US 11,330,696 B2
(45) Date of Patent: May 10, 2022

(54) SYSTEMS AND METHODS FOR HIGH VOLTAGE GENERATION

(71) Applicant: SHANGHAI UNITED IMAGING HEALTHCARE CO., LTD., Shanghai (CN)

(72) Inventors: Tieshan Zhang, Shanghai (CN); Guoping Zhu, Shanghai (CN); Bobin Tong, Shanghai (CN); Jinglin Wu, Shanghai (CN); Xu Chu, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 94 days.

(21) Appl. No.: 16/666,438

(22) Filed: Oct. 29, 2019

(65) Prior Publication Data

US 2020/0396817 A1  Dec. 17, 2020

(30) Foreign Application Priority Data

Jun. 13, 2019  (CN) .......................... 201910511137.6

(51) Int. Cl.
*H05G 1/10* (2006.01)
*H05G 1/32* (2006.01)
*H05G 1/58* (2006.01)

(52) U.S. Cl.
CPC ................ *H05G 1/10* (2013.01); *H05G 1/32* (2013.01); *H05G 1/58* (2013.01)

(58) Field of Classification Search
CPC .. H03K 3/53; H05G 1/10; H05G 1/12; H05G 1/32

See application file for complete search history.

(56) References Cited

U.S. PATENT DOCUMENTS

| | | | | |
|---|---|---|---|---|
| 4,013,936 A | * | 3/1977 | Hesler | H05G 1/32 363/25 |
| 4,216,382 A | * | 8/1980 | Franke | H05G 1/10 378/105 |
| 5,602,897 A | * | 2/1997 | Kociecki | H05G 1/06 378/101 |
| 2007/0274457 A1 | | 11/2007 | Dunham et al. | |
| 2008/0130323 A1 | * | 6/2008 | Wagner | H02M 3/337 363/21.02 |
| 2016/0192466 A1 | | 6/2016 | Larroux et al. | |
| 2017/0086775 A1 | | 3/2017 | Madhav et al. | |
| 2020/0337759 A1 | | 10/2020 | Zhu et al. | |
| 2020/0343069 A1 | | 10/2020 | Zhu et al. | |
| 2021/0007210 A1 | | 1/2021 | Steadman Booker et al. | |

FOREIGN PATENT DOCUMENTS

CN  202424546 U  9/2012

* cited by examiner

*Primary Examiner* — Chih-Cheng Kao
(74) *Attorney, Agent, or Firm* — Metis IP LLC

(57) ABSTRACT

The present disclosure relates to a high voltage generator including multiple high voltage generating modules configured to provide a total voltage. Each of the multiple high voltage generating modules may be configured to receive a driving pulse and generate a voltage component of the total voltage according to the driving pulse. The multiple high voltage generating modules may be in a series connection. Time points when the multiple high voltage generating modules receive driving pulses may be different, and waveforms of the driving pulses may be the same.

20 Claims, 10 Drawing Sheets

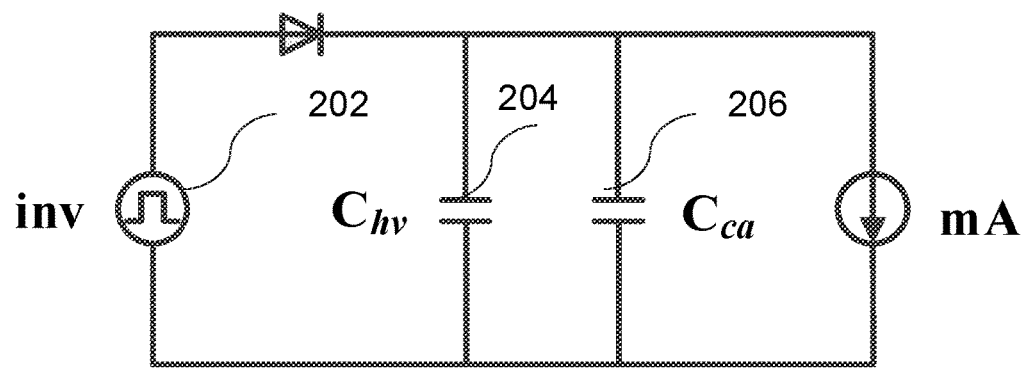
FIG. 2A
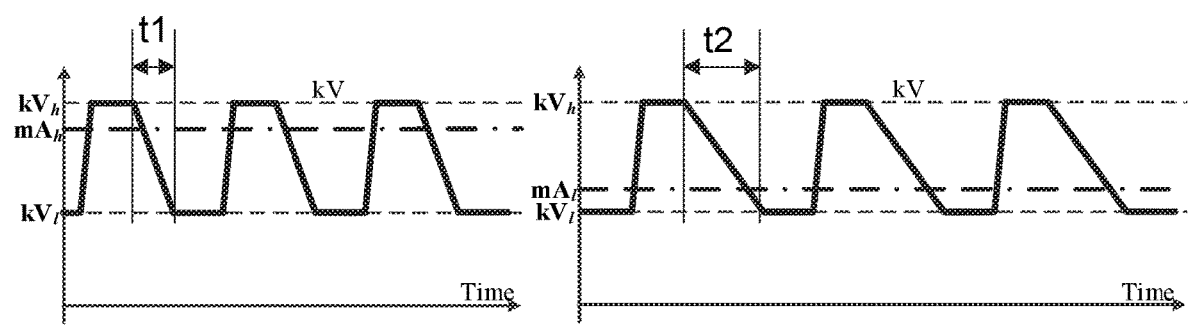
FIG. 2B
FIG. 2C

SYSTEMS AND METHODS FOR HIGH VOLTAGE GENERATION

CROSS-REFERENCE TO RELATED APPLICATIONS

This application claims the priority of Chinese Patent Application No. 201910511137.6, filed on Jun. 13, 2019, the contents of which are hereby incorporated by reference.

TECHNICAL FIELD

The disclosure generally relates to X-ray systems, and more particularly relates to systems and methods for high voltage generation.

BACKGROUND

X-rays have been widely used in medical diagnosis, radiotherapy planning, surgery planning, radiotherapy, and other medical procedures. For example, energy imaging techniques are used to distinguish different substances of a subject based on the energy dependencies of attenuation coefficients of different substances. Using an energy imaging technique (e.g., a dual-energy imaging technique), a high voltage generator may be used to provide a tube voltage rapidly switching between a low voltage to a high voltage to a radiation source for generating radiation rays. A declining speed of the tube voltage decreasing from the high voltage to the low voltage may be determined by an output capacitance of the high voltage generator. The lower the output capacitance of the high voltage generator, the greater the declining speed of the tube voltage may be. However, the low output capacitance may cause the tube voltage to include ripple waves, which can decrease quality (e.g. contrast, resolution, etc.) of an obtained image generated using an energy imaging device (e.g., a computed tomography (CT)). Therefore, it is desirable to provide systems and methods for generating a tube voltage with low or no energies of ripple waves.

SUMMARY

According to a first aspect of the present disclosure, a high voltage generator is provided. The high voltage generator may include multiple high voltage generating modules configured to provide a total voltage. Each of the multiple high voltage generating modules may be configured to receive a driving pulse and generate a voltage component of the total voltage according to the driving pulse. The multiple high voltage generating modules may be in a series connection. Time points when the multiple high voltage generating modules receive driving pulses may be different, and waveforms of the driving pulses may be the same.

In some embodiments, the high voltage generator may include a driving module. The driving module may be configured to generate the driving pulse and transmit the driving pulse to each of the multiple high voltage generating modules.

In some embodiments, the high voltage generator may include multiple driving modules. Each of the multiple driving modules may be operably connected to one of the multiple high voltage generating modules. Each of the multiple driving modules may be configured to generate the driving pulse and transmit the driving pulse to the one of the multiple high voltage generating modules.

In some embodiments, an energy of a total ripple wave included in the total voltage may be lower than a threshold. The total ripple wave may be formed by a superposition of ripple waves included in voltage components generated by the multiple high voltage generating modules.

In some embodiments, an energy of a total ripple wave included in the total voltage may be smaller than an energy of a ripple wave included in the voltage component generated by each of the multiple high voltage generating modules. The total ripple wave may be formed by a superposition of ripple waves included in voltage components generated by the multiple high voltage generating modules.

In some embodiments, differences between consecutive time points when two high voltage generating modules among the multiple high voltage generating modules receive driving pulses consecutively may be the same or different.

In some embodiments, differences between time points when two adjacent high voltage generating modules among the multiple high voltage generating modules receive driving pulses may be the same or different. The two adjacent high voltage generating modules may be next to each other in the series connection and electrically connected.

In some embodiments, the multiple high voltage generating modules may include a first high voltage generating module, a second high voltage generating module, and a third high voltage generating module. The first high voltage generating module may be configured to receive the driving pulse at a first time point, the second high voltage generating module may be configured to receive the driving pulse at a second time point, the third high voltage generating module may be configured to receive the driving pulse at a third time point. A difference between the first time point and the second time point may be the same as or different from a difference between the second time point and the third time point.

In some embodiments, the second high voltage generating module may be next to and electrically connected to the first high voltage generating module in the series connection, and the third high voltage generating module may be next to and electrically connected to the second high voltage generating module in the series connection.

In some embodiments, the first time point may be later than the second time point, and the second time point may be later than the third time point.

In some embodiments, the first time point may be earlier than the second time point, and the second time point may be earlier than the third time point.

In some embodiments, one of the multiple high voltage generating modules may include an inverter circuit, a high voltage generating unit, and a rectifier. The inverter circuit may be configured to convert a direct voltage into an alternating voltage in response to receipt of a driving pulse. The high voltage generating unit may be configured to increase the alternating voltage to obtain an increased alternating voltage. The rectifier may be configured to convert the increased alternating voltage into the voltage component.

In some embodiments, the high voltage generating module may further include a resonant circuit configured to perform a filtering operation on the alternating voltage.

In some embodiments, one of the multiple high voltage generating modules may further include one or more power modules configured to provide the direct voltage to the inverter circuit.

In some embodiments, the total voltage may be provided to a radiation source of an imaging device for energy imaging.

According to a second aspect of the present disclosure, a system is provided. The system may include a radiation source configured to generate radiation rays. The radiation source may include a high voltage generator and a tube. The high voltage generator may include multiple high voltage generating modules configured to provide a voltage to the tube for generating radiation rays. Each of the multiple high voltage generating modules may be configured to receive a driving pulse and generate a voltage component of the voltage according to the driving pulse. The system may further include a detector configured to receive at least a portion of the radiation rays and generate imaging data. The multiple high voltage generating modules may be in a series connection. Time points when the multiple high voltage generating modules receive driving pulses may be different, and waveforms of the driving pulses may be the same.

According to a third aspect of the present disclosure, a method is provided. The method may be implemented on a high voltage generator including multiple high voltage generating modules in a series connection and one or more driving modules. The high voltage generator may be configured to provide a voltage to a tube for generating radiation rays. The method may include generating a driving pulse by each of the one or more driving pulse modules, transmitting the driving pulse to at least one of the multiple high voltage generating modules, generating a voltage component of the voltage in response to receipt of the driving pulse by each of the multiple high voltage generating modules. Time points when the multiple high voltage generating modules receive driving pulses may be different, and waveforms of the driving pulses may be the same.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein:

FIG. 2A is a schematic diagram illustrating an exemplary equivalent circuit of a high voltage generator according to some embodiments of the present disclosure;

FIG. 2B is a diagram illustrating an exemplary waveform of a tube voltage according to some embodiments of the present disclosure;

FIG. 2C is a diagram illustrating an exemplary waveform of a tube voltage according to some embodiments of the present disclosure;

DETAILED DESCRIPTION

Figure 1:
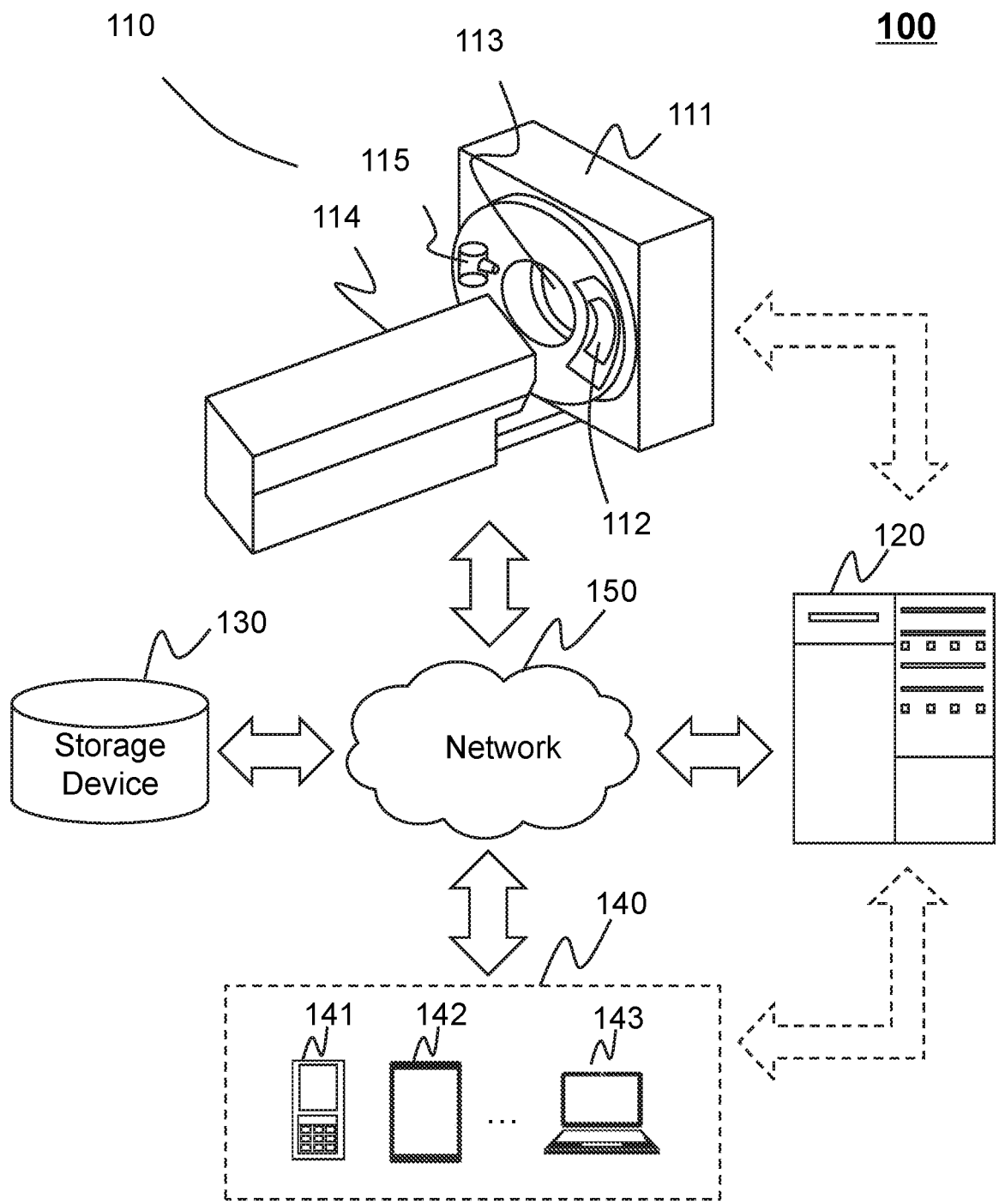
FIG. 1 is a schematic diagram illustrating an exemplary imaging system according to some embodiments of the present disclosure.

The following description is presented to enable any person skilled in the art to make and use the present disclosure and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown but is to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including" when used in this disclosure, specify the presence of stated features, integers, steps, operations, elements, and/or components, but do not preclude the presence or addition of one or more other features, integers, steps, operations, elements, components, and/or groups thereof.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an erasable programmable read-only memory (EPROM). It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

It will be understood that the term "system," "engine," "unit," "module," and/or "block" used herein are one method to distinguish different components, elements, parts, sections or assembly of different levels in ascending order. However, the terms may be displaced by another expression if they achieve the same purpose.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments in the present disclosure. It is to be expressly understood, the operations of the flowchart may be implemented not in order. Conversely, the operations may be implemented in an inverted order, or simultaneously. Moreover, one or more other operations may be added to the flowcharts. One or more operations may be removed from the flowcharts.

Provided herein are systems and methods for high voltage generation. The system may include a high voltage generator including multiple high voltage generating modules configured to provide a total voltage. Each of the multiple high voltage generating modules may be configured to receive a driving pulse and generate a voltage component of the total voltage according to the driving pulse. The multiple high voltage generating modules may be in a series connection. Time points when the multiple high voltage generating modules receive driving pulses may be different. Waveforms of the driving pulses received by the multiple driving modules may be the same.

Accordingly, ripple waves included in voltage components generated by the multiple high voltage modules may include phase differences as a result of the different time points when the multiple high voltage generating modules receive the driving pulses. The energies of the ripple waves included in the voltage components may completely or partially cancel each other when the ripple waves are superimposed. The system may generate the total voltage composed of the voltage components. The total voltage may include a total ripple wave with low energy or no ripple wave as a result of a partial or complete cancellation of the ripple waves included in the voltage components when the ripple waves are superimposed. In some embodiments, the systems and methods provided herein may provide to a radiation source the total voltage (i.e., a tube voltage) rapidly switching between a low voltage and a high voltage. The systems and methods may improve a declining speed of the tube voltage decreasing from the high voltage to the low voltage via reducing an output capacitance of the high voltage generator, which does not increase the energy of the total ripple wave included in the total voltage, thereby improving quality (e.g. contrast, resolution, etc.) of one or more images generated using an energy imaging device (e.g., an X-ray imaging device).

It should be noted that the imaging system 100 described below is merely provided for illustration purposes, and not intended to limit the scope of the present disclosure. For persons having ordinary skills in the art, a certain amount of variations, changes, and/or modifications may be deducted under the guidance of the present disclosure. Those variations, changes, and/or modifications do not depart from the scope of the present disclosure. For example, the systems and methods for high voltage generation may be used in a treatment system, such as an image-guided radiotherapy (IGRT) system, an X-ray treatment system, etc. Merely by way of example, the IGRT system may include, for example, a CT guided radiotherapy system.

FIG. 1 is a schematic diagram illustrating an exemplary imaging system according to some embodiments of the present disclosure. In some embodiments, the imaging system 100 may be applied to any application scenario in which radiation rays (e.g., X-rays) are used for generating images and/or providing treatment, such as a computed tomography (CT) system, a digital radiography (DR) system, a C-arm X-ray system, a computed tomography-positron emission tomography (CT-PET) system, or the like, or a combination thereof.

As illustrated in FIG. 1, the imaging system 100 may include an imaging device 110, a processing device 120, a storage device 130, one or more terminals 140, and a network 150. The components in the imaging system 100 may be connected in one or more of various ways. Merely by way of example, the imaging device 110 may be connected to the processing device 120 through the network 150. As another example, the imaging device 110 may be connected to the processing device 120 directly as indicated by the bi-directional arrow in dotted lines linking the imaging device 110 and the processing device 120. As a further example, the storage device 130 may be connected to the processing device 120 directly or through the network 150. As still a further example, the terminal 140 may be connected to the processing device 120 directly (as indicated by the bi-directional arrow in dotted lines linking the terminal 140 and the processing device 120) or through the network 150.

The imaging device 110 may be configured to scan a subject using radiation rays and generate imaging data used to generate one or more images relating to the subject. The imaging data relating to at least one part of the subject may include an image (e.g., an image slice), projection data, or a combination thereof. In some embodiments, the imaging data may be a two-dimensional (2D) imaging data, a three-dimensional (3D) imaging data, a four-dimensional (4D) imaging data, or the like, or any combination thereof. In some embodiments, the imaging device 110 may transmit the imaging data to the processing device 120 for further processing (e.g., generating one or more images). In some embodiments, the imaging data and/or the one or more images associated with the subject may be stored in the storage device 130 and/or the processing device 120. In some embodiments, the imaging device 110 may include a computed tomography (CT) scanner, a digital radiography (DR) scanner, a C-arm X-ray scanner, a digital subtraction angiography (DSA) scanner, a dynamic spatial reconstructor (DSR) scanner, an X-ray microscopy scanner, a multi-modality scanner, or the like, or a combination thereof. Exemplary multi-modality scanners may include a computed tomography-positron emission tomography (CT-PET) scanner, a computed tomography-magnetic resonance imaging (CT-MRI) scanner, etc. In some embodiments, one or more components in the imaging system 100 may be omitted. Merely by way of example, the imaging system 100 may not include the terminal(s) 140.

The imaging device 110 may include a gantry 111, one or more detectors 112, a detecting region 113, a table 114, a radiation source 115, or any other components. The gantry 111 may be configured to provide support for other components (e.g., the radiation source 115, the detector(s) 112, etc.) of the imaging device 110. In some embodiments, the detector(s) 112 and the radiation source 115 may be oppositely mounted on the gantry 111. In some embodiments, the gantry 111 may rotate and/or move. The detector(s) 112 and the radiation source 115 may rotate along with the rotation of the gantry 111. The table 114 may be configured to locate and/or support a scanned object. A scanned object may be placed on the table 114 and moved into the detecting regions 113 (e.g., a space between the detectors 112 and the radiation source 115) of the imaging device 110. The scanned object may be biological or non-biological. Merely by way of example, the scanned object may include a patient, a man-made object, etc. As another example, the scanned object may include a specific portion, organ, and/or tissue of the patient. For example, the scanned object may include the head, the brain, the neck, the body, a shoulder, an arm, the thorax, the heart, the stomach, a blood vessel, a soft tissue, a knee, feet, or the like, or any combination thereof. In the present disclosure, "subject", "object" or "scanned object" are used interchangeably.

The radiation source 115 may be configured to generate and/or emit radiation rays (e.g., X-rays) to scan the scanned object that is placed on the table 114. In some embodiments, the radiation source 115 may include a high voltage generator, one or more tubes, or any other components (e.g., a collimator). The high voltage generator may be configured to provide a voltage and/or current for the tube and/or provide power for other components (e.g., a cathode filament) of the radiation source 115. For example, the high voltage generator may be configured to provide a tube voltage switching between a high voltage and a low voltage to the tube according to a reference waveform (e.g., a sinusoidal waveform, a rectangle waveform, a triangle waveform, etc.). More descriptions regarding the reference waveform of a tube voltage may be found in, e.g., U.S. Application No. 16/666435 entitled "SYSTEMS AND METHODS FOR X-RAY IMAGING," filed on even date (Attorney Docket No.: 20618-0496US00), which is incorporated by reference. The high voltage generator may include a controller and multiple high voltage generating modules. A high voltage generating module may include an inverter circuit, a rectifier, a high voltage generating circuit, or one or more other units (e.g., a resonant circuit). The controller may be configured to control and/or monitor one or more components (e.g., an inverter circuit) of the high voltage generator. For example, the controller may cause a driving pulse to be generated and transmitted to the inverter circuit of one or more of the multiple high voltage generating modules. The driving pulse may drive the inverter circuit of a high voltage generating module to generate and/or provide a voltage switching between a first voltage and a second voltage higher than the first voltage. The inverter circuit may be configured to convert a direction voltage provided by a direct power into an alternating voltage. The high voltage generating circuit may be configured to increase the alternating voltage to obtain a high alternating voltage. The rectifier may be configured to convert the high alternating voltage into the tube voltage. The tube may be configured to generate radiation rays when the high voltage generator applies the generated voltage to the tube. As used herein, the voltage applied by the high voltage generator may also be referred to as a tube voltage. In some embodiments, the tube may include a cathode filament and an anode target. The voltage generated by the high voltage generator may trigger the cathode filament to emit a plurality of electrons to form an electron beam. The emitted electron beam may be impinged on a small area (i.e., the focus) on the anode target to generate radiation beams (e.g., X-rays beams) consisting of high-energetic photons. In some embodiments, the radiation rays may include X-rays, γ-rays, α-rays, or the like, or any combination thereof. In some embodiments, the radiation source 115 may include a focusing device configured to shape a focus of the radiation rays generated by the tube. More descriptions regarding the focus of the radiation rays may be found in, e.g., U.S. Application No. 16/666436 entitled "SYSTEMS AND METHODS FOR FOCUS CONTROL IN X-RAYS," filed on even date (Attorney Docket No.: 20618-0497US00), which is incorporated by reference.

The detector 112 may detect the radiation beams penetrated through at least part of the scanned object within the detection region 113. In some embodiments, the imaging device 110 may include one single detector which may be configured to detect at least a portion of the radiation rays emitted by the radiation source 115 when the tube voltage of the tube switches between a first voltage and a second voltage higher than the first voltage. In some embodiments, the imaging device 110 may include two detectors. One detector may be configured to detect a first portion of the radiation rays emitted by the radiation source 115 responding to a first voltage, and another detector may be configured to detect a second portion of the radiation rays emitted by the radiation source 115 responding to a second voltage higher than the first voltage. In some embodiments, the detector(s) 112 may include a plurality of detector units, which may be arranged in any suitable manner, for example, a channel direction and a row direction. The detector(s) 112 may include a scintillation detector (e.g., a cesium iodide detector), a gas detector, etc.

The processing device 120 may process data and/or information obtained from the imaging device 110, the terminal(s) 140, and/or the storage device 130. For example, the processing device 120 may cause each of one or more driving modules to generate a driving pulse. The processing device 120 may cause the driving pulse to be transmitted to at least one of the multiple high voltage generating modules. The processing device 120 may record the time points when the multiple high voltage generating modules receive driving pulses. The time points may be different. The processing device 120 may cause each of the multiple high voltage generating modules to generate a voltage component of the voltage according to the driving pulse, wherein waveforms of the driving pulses may be the same. The processing device 120 may be a central processing unit (CPU), a digital signal processor (DSP), a system on a chip (SoC), a microcontroller unit (MCU), or the like, or any combination thereof. The processing device 120 may be integrated into the high voltage generator.

In some embodiments, the processing device 120 may be a computer, a user console, a single server or a server group, etc. The server group may be centralized or distributed. In some embodiments, the processing device 120 may be local or remote. For example, the processing device 120 may access information and/or data stored in the imaging device 110, the terminal(s) 140, and/or the storage device 130 via the network 150. As another example, the processing device 120 may be directly connected to the imaging device 110, the terminal(s) 140 and/or the storage device 130 to access stored information and/or data. In some embodiments, the processing device 120 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the processing device 120 may be implemented on a computing device 300 having one or more components illustrated in FIG. 3 in the present disclosure.

The storage device 130 may store data, instructions, and/or any other information. In some embodiments, the storage device 130 may store data obtained from the terminal(s) 140 and/or the processing device 120. For example, the storage device 130 may store one or more images obtained from the processing device 120. In some embodiments, the storage device 130 may store data and/or instructions that the processing device 120 may execute or use to perform exemplary methods/systems described in the present disclosure. For example, the storage device 130 may store data and/or instructions that the processing device 120 may execute or use to generate an image that satisfies target brightness. In some embodiments, the storage device 130 may include a mass storage, removable storage, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memories may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 130 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 130 may be connected to the network 150 to communicate with one or more other components of the imaging system 100 (e.g., the processing device 120, the terminal(s) 140, etc.). One or more components of the imaging system 100 may access the data or instructions stored in the storage device 130 via the network 150. In some embodiments, the storage device 130 may be directly connected to or communicate with one or more other components of the imaging system 100 (e.g., the processing device 120, the terminal(s) 140, etc.). In some embodiments, the storage device 130 may be part of the processing device 120.

The terminal(s) 140 may include a mobile device 141, a tablet computer 142, a laptop computer 143, or the like, or any combination thereof. In some embodiments, the mobile device 141 may include a smart home device, a wearable device, a mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a bracelet, a footgear, eyeglasses, a helmet, a watch, clothing, a backpack, a smart accessory, or the like, or any combination thereof. In some embodiments, the mobile device may include a mobile phone, a personal digital assistant (PDA), a gaming device, a navigation device, a point of sale (POS) device, a laptop, a tablet computer, a desktop, or the like, or any combination thereof. In some embodiments, the virtual reality device and/or the augmented reality device may include a virtual reality helmet, virtual reality glasses, a virtual reality patch, an augmented reality helmet, augmented reality glasses, an augmented reality patch, or the like, or any combination thereof. For example, the virtual reality device and/or the augmented reality device may include a Google Glass™, an Oculus Rift™, a Hololens™, a Gear VR™, etc. In some embodiments, the terminal(s) 140 may remotely operate the imaging device 110. In some embodiments, the terminal(s) 140 may operate the imaging device 110 via a wireless connection. In some embodiments, the terminal(s) 140 may receive information and/or instructions inputted by a user, and send the received information and/or instructions to the imaging device 110 or to the processing device 120 via the network 150. In some embodiments, the terminal(s) 140 may receive data and/or information from the processing device 120. In some embodiments, the terminal(s) 140 may be part of the processing device 120. In some embodiments, the terminal(s) 140 may be omitted.

The network 150 may include any suitable network that can facilitate the exchange of information and/or data for the imaging system 100. In some embodiments, one or more components of the imaging system 100 (e.g., the imaging device 110, the terminal(s) 140, the processing device 120, the storage device 130) may communicate information and/or data with one or more other components of the imaging system 100 via the network 150. For example, the processing device 120 may obtain data from the imaging device 110 via the network 150. As another example, the processing device 120 may obtain user instructions from the terminal(s) 140 via the network 150. In some embodiments, the network 150 may be any type of wired or wireless network, or a combination thereof. The network 150 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, and/or any combination thereof. Merely by way of example, the network 150 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 150 may include one or more network access points. For example, the network 150 may include wired and/or wireless network access points such as base stations and/or internet exchange points through which one or more components of the imaging system 100 may be connected to the network 150 to exchange data and/or information.

It should be noted that the above description of the imaging system 100 is merely provided for the purposes of illustration, and not intended to limit the scope of the present disclosure. For persons having ordinary skills in the art, multiple variations and modifications may be made under the teachings of the present disclosure. For example, the assembly and/or function of the imaging system 100 may be varied or changed according to specific implementation scenarios. For instance, the system 100 may be a system including a radiation device 110. The system 100 may be configured to deliver radiation for imaging and/or treatment purposes. The disclosure with reference to the radiation device 110 is an imaging device for illustration purposes and not intended to be limiting.

FIG. 2A is a schematic diagram illustrating an exemplary equivalent circuit of a high voltage generator according to some embodiments of the present disclosure. In some embodiments, the high voltage generator may be configured to provide a tube voltage and/or tube current for a tube. As shown in FIG. 2A, the equivalent circuit 200 may include an inverter 202, an output filter capacitor 204, and a stray capacitor 206. The output filter capacitor 204 may provide an output filter capacitance denoted as $C_{hv}$. The stray capacitor 206 may provide a stray capacitance denoted as $C_{ca}$. mA may refer to a tube current. The inverter 202 may decrease a tube voltage from a high voltage to a low voltage based on a discharge of the output filter capacitor 204 and/or the stray capacitor 206. The discharge of the output filter capacitor 204 and/or the stray capacitor 206 may be realized based on the tube current provided to a load (e.g., a tube of an imaging device). The discharge time of the output filter capacitor 204 and/or the stray capacitor 206 may be associated with the tube current mA. The lower the tube current is, the longer the discharge time of the output filter capacitor 204 and/or the stray capacitor 206 may be. As a feature of the equivalent circuit of a high voltage generator (e.g., the discharge time), the tube voltage declining from the high voltage to the low voltage may need a transition time. The transition time (or a declining speed) of the tube voltage declining from the high voltage to a low voltage may be determined based at least in part on an equivalent output capacitance (including the stray capacitance $C_{ca}$ and the filter capacitance $C_{hv}$) and the tube current. The smaller the tube current is, the greater the transition time may be, and the lower the declining speed of the tube voltage may be. The greater the equivalent output capacitance (including the stray capacitance $C_{ca}$ and the filter capacitance $C_{hv}$) is, the lower the declining speed of the tube voltage may be. Therefore, reducing an output capacitance (or equivalent output capacitance) of the high voltage generator may achieve a fast switching between the high voltage and the low voltage.

FIGS. 2B and 2C are diagrams illustrating exemplary waveforms of a tube voltage according to some embodiments of the present disclosure. As shown in FIGS. 2B and 2C, $mA_h$ may refer to a first tube current (i.e., a high current). $mA_l$ may refer to a second tube current (i.e., a low current) lower than the first current. $kV_h$ may refer to a first voltage (i.e., a high voltage), and $kV_l$ may refer to a second voltage (i.e., a low voltage) lower than the first voltage. The time length (e.g., t1 as shown) that it takes for the tube voltage to change from the high voltage $kV_h$ to the low voltage $kV_l$ when the tube current is equal to the high current $mA_h$ is shorter than the time length (e.g., t2 as shown) that it takes for the tube voltage to change from the high voltage $kV_h$ to the low voltage $kV_l$ when the tube current is equal to the low current $mA_l$. For example, if the output capacitance of the high voltage generator is 1 nF and the tube current is 200 mA, the time length that it takes for the tube voltage to decrease from the high voltage 140 kV to the low voltage 80 kV is about 300 microseconds. If the output capacitance of the high voltage generator is 1 nF and the tube current is 100 mA, the time length that it takes for the tube voltage to decrease from the high voltage 140 kV to the low voltage 80 kV is about 600 microseconds.

Figure 2D:
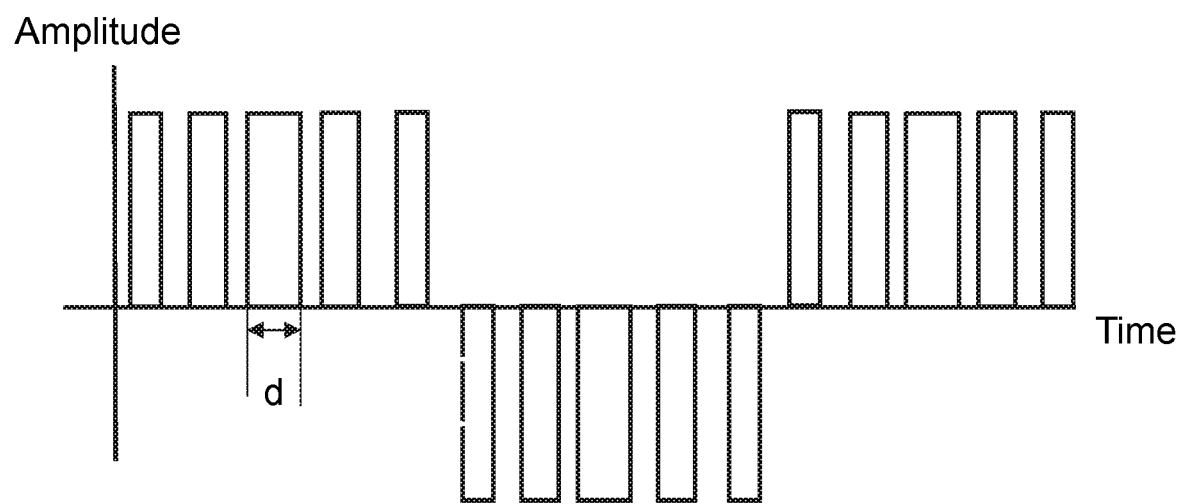
FIG. 2D is a diagram illustrating an exemplary driving pulse according to some embodiments of the present disclosure.
Figure 6:
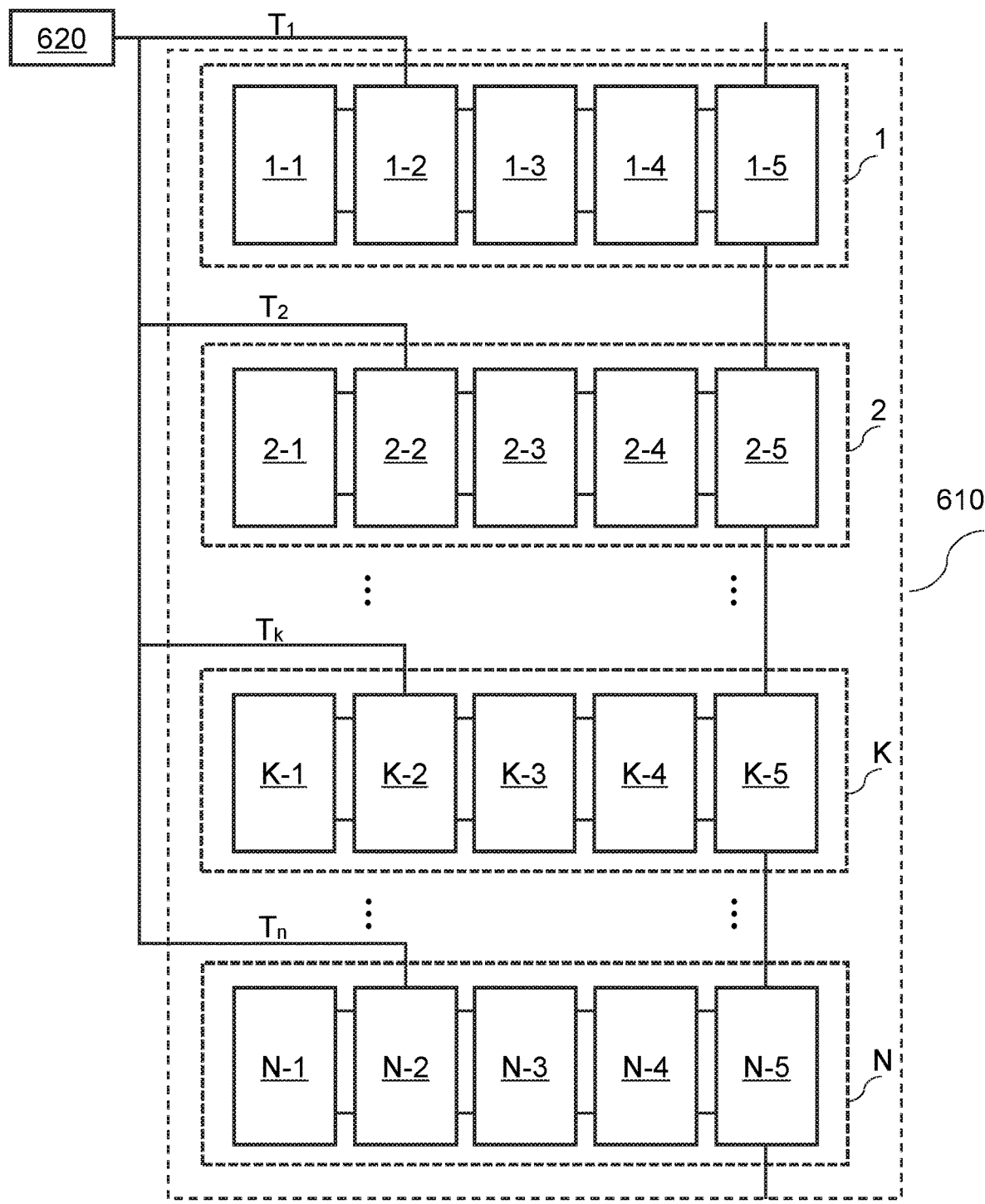
FIG. 6 is a schematic diagram illustrating an exemplary high voltage generator according to some embodiments of the present disclosure.
Figure 8:
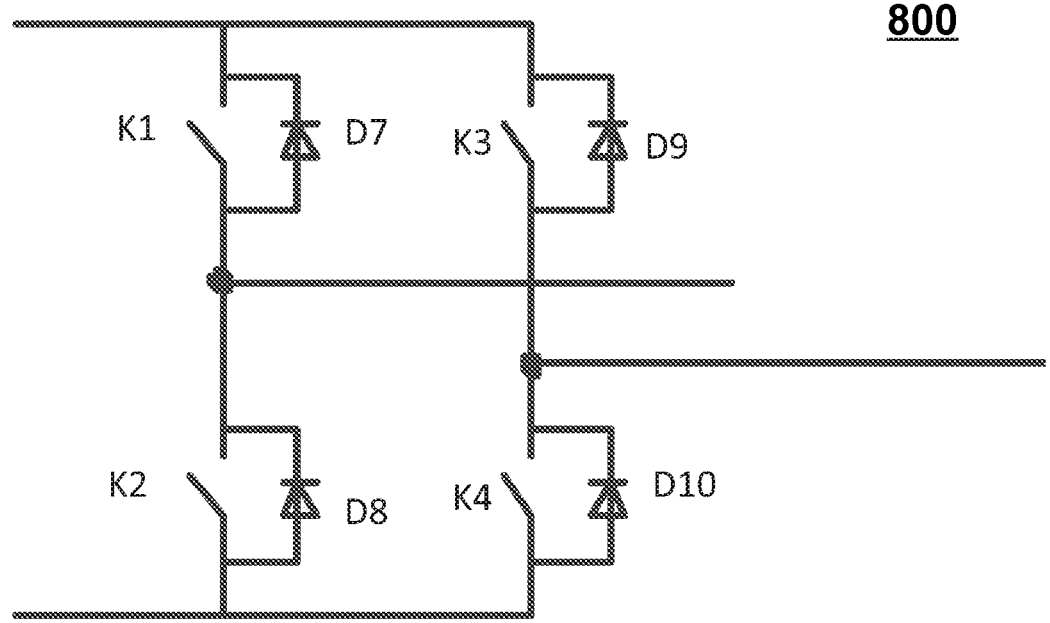
FIG. 8 is a diagram illustrating an exemplary inverter circuit according to some embodiments of the present disclosure.

FIG. 2D is a diagram illustrating an exemplary driving pulse according to some embodiments of the present disclosure. As shown in FIG. 2D, a waveform of the driving pulse is a rectangular waveform. The driving pulse may be modulated using a pulse width modulation (PWM) technique. The driving pulse may be denoted as a pulse sequence including multiple pulses. The widths (denoted by d as shown in FIG. 2D) of the multiple pulses may vary with time to change an output voltage of an inverter (e.g., the inverter circuit 1-2 as shown in FIG. 6) of a high voltage generating module (e.g., the high voltage generating module 1 as shown in FIG. 6) of a high voltage generator when the high voltage generating module receives the driving pulse. The driving pulse may be used to control a time length that one or more switches (e.g., switches K1, K2, K3, and K4 as shown in FIG. 8) of the inverter are maintained at opening to change an output voltage of an inverter (e.g., the inverter circuit 1-2 as shown in FIG. 6). The greater that the time length that one or more switches (e.g., switches K1, K2, K3, and K4 as shown in FIG. 8) of the inverter are maintained at opening, the higher the output voltage of the inverter (e.g., the inverter circuit 1-2 as shown in FIG. 6) may be, and the higher a voltage generated by the high voltage module may be.

Figure 3:
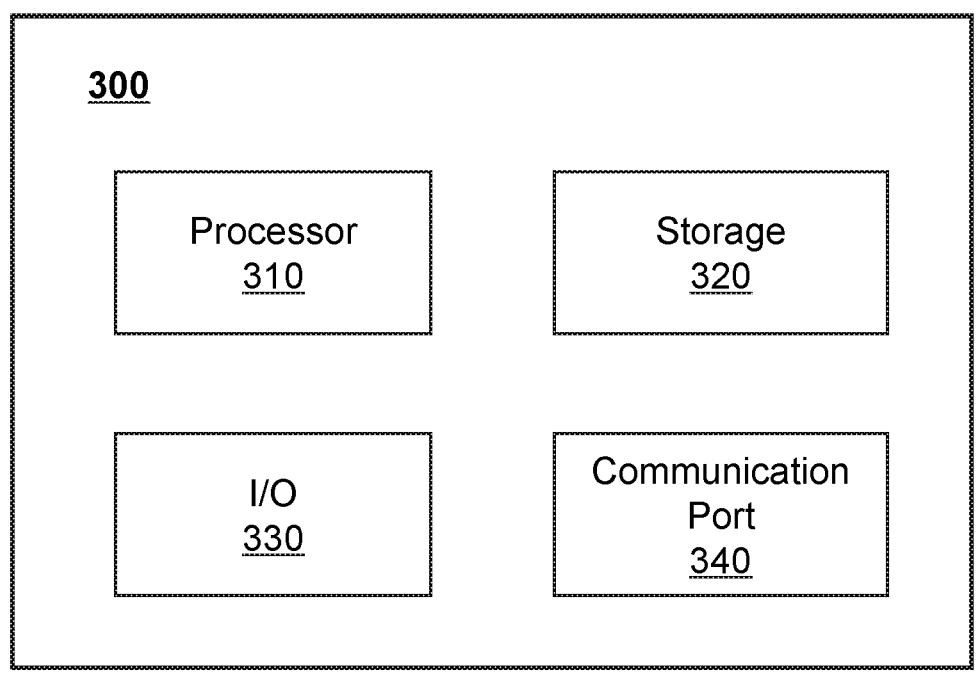
FIG. 3 is a schematic diagram illustrating exemplary hardware and/or software components of a computing device according to some embodiments of the present disclosure.

FIG. 3 is a schematic diagram illustrating hardware and/or software components of an exemplary computing device 300 on which the processing device 120 may be implemented according to some embodiments of the present disclosure. As illustrated in FIG. 2, the computing device 300 may include a processor 310, a storage 320, an input/output (I/O) 330, and a communication port 340.

The processor 310 may execute computer instructions (program codes) and perform functions of the processing device 120 in accordance with techniques described herein. The computer instructions may include, for example, routines, programs, objects, components, signals, data structures, procedures, modules, and functions, which perform particular functions described herein. For example, the processor 310 may process data obtained from the imaging device 110, the terminal(s) 140, the storage device 130, and/or any other component of the imaging system 100. Specifically, the processor 310 may process one or more measured data sets obtained from the imaging device 110. For example, the processor 310 may reconstruct an image based on the data set(s). In some embodiments, the reconstructed image may be stored in the storage device 130, the storage 320, etc. In some embodiments, the reconstructed image may be displayed on a display device by the I/O 330. In some embodiments, the processor 310 may perform instructions obtained from the terminal(s) 140. In some embodiments, the processor 310 may include one or more hardware processors, such as a microcontroller, a microprocessor, a reduced instruction set computer (RISC), an application-specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field-programmable gate array (FPGA), an advanced RISC machine (ARM), a programmable logic device (PLD), any circuit or processor capable of executing one or more functions, or the like, or any combinations thereof.

Merely for illustration, only one processor is described in the computing device 300. However, it should be noted that the computing device 300 in the present disclosure may also include multiple processors. Thus operations and/or method steps that are performed by one processor as described in the present disclosure may also be jointly or separately performed by the multiple processors. For example, if in the present disclosure the processor of the computing device 300 executes both operation A and operation B, it should be understood that operation A and operation B may also be performed by two or more different processors jointly or separately in the computing device 300 (e.g., a first processor executes operation A and a second processor executes operation B, or the first and second processors jointly execute operations A and B).

The storage 320 may store data/information obtained from the imaging device 110, the terminal(s) 140, the storage device 130, or any other component of the imaging system 100. In some embodiments, the storage 320 may include a mass storage device, a removable storage device, a volatile read-and-write memory, a read-only memory (ROM), or the like, or any combination thereof. For example, the mass storage may include a magnetic disk, an optical disk, a solid-state drive, etc. The removable storage may include a flash drive, a floppy disk, an optical disk, a memory card, a zip disk, a magnetic tape, etc. The volatile read-and-write memory may include a random access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage 320 may store one or more programs and/or instructions to perform exemplary methods described in the present disclosure. For example, the storage 320 may store a program for the processing device 120 for generating attenuation correction data for a PET image.

The I/O 330 may input or output signals, data, and/or information. In some embodiments, the I/O 330 may enable user interaction with the processing device 120. In some embodiments, the I/O 330 may include an input device and an output device. Exemplary input devices may include a keyboard, a mouse, a touch screen, a microphone, or the like, or a combination thereof. Exemplary output devices may include a display device, a loudspeaker, a printer, a projector, or the like, or a combination thereof. Exemplary display devices may include a liquid crystal display (LCD), a light-emitting diode (LED)-based display, a flat panel display, a curved screen, a television device, a cathode ray tube (CRT), or the like, or a combination thereof.

The communication port 340 may be connected with a network (e.g., the network 150) to facilitate data communications. The communication port 340 may establish connections between the processing device 120 and the imaging device 110, the terminal(s) 140, or the storage device 130. The connection may be a wired connection, a wireless connection, or a combination of both that enables data transmission and reception. The wired connection may include an electrical cable, an optical cable, a telephone wire, or the like, or any combination thereof. The wireless connection may include a Bluetooth network, a Wi-Fi network, a WiMax network, a WLAN, a ZigBee network, a mobile network (e.g., 3G, 4G, 5G, etc.), or the like, or any combination thereof. In some embodiments, the communication port 340 may be a standardized communication port, such as RS232, RS485, etc. In some embodiments, the communication port 340 may be a specially designed communication port. For example, the communication port 340 may be designed in accordance with the digital imaging and communications in medicine (DICOM) protocol.

Figure 4:
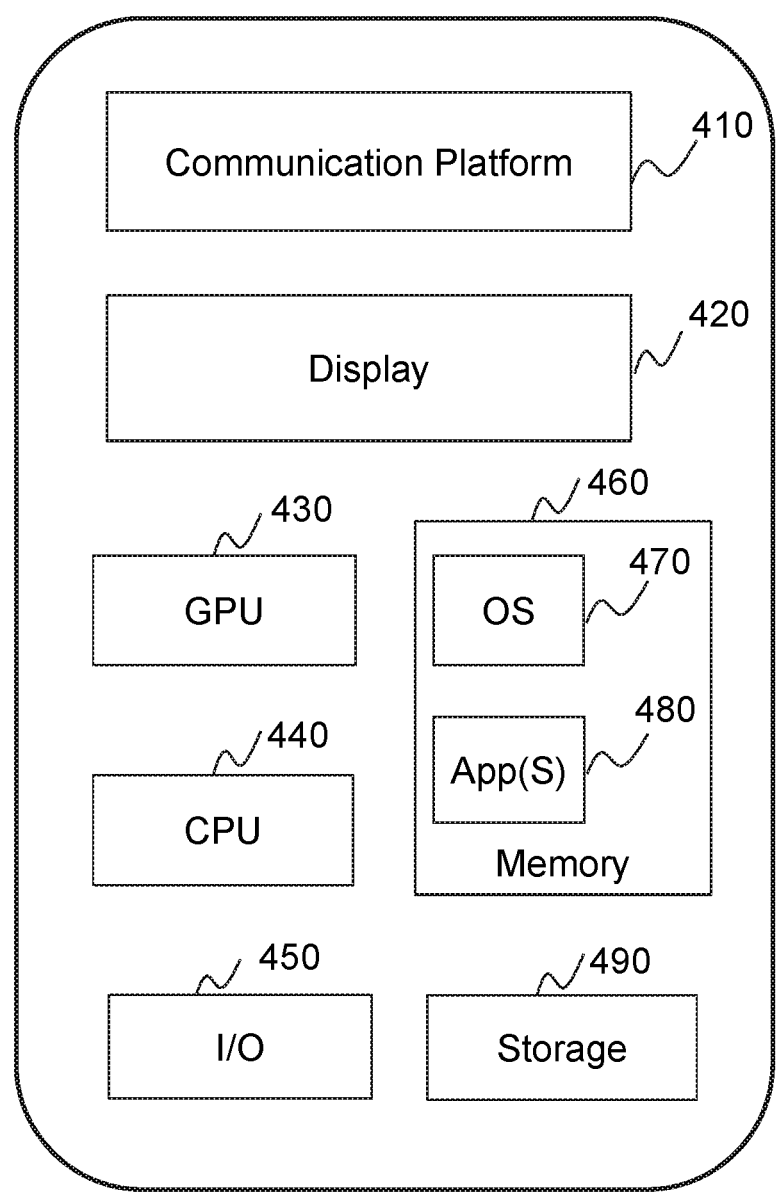
FIG. 4 is a schematic diagram illustrating exemplary hardware and/or software components of a mobile device according to some embodiments of the present disclosure.

FIG. 4 is a schematic diagram illustrating hardware and/or software components of an exemplary mobile device 400 according to some embodiments of the present disclosure. As illustrated in FIG. 4, the mobile device 400 may include a communication platform 410, a display 420, a graphics processing unit (GPU) 430, a central processing unit (CPU) 440, an I/O 450, a memory 460, and a storage 490. In some embodiments, any other suitable component, including but not limited to a system bus or a controller (not shown), may also be included in the mobile device 400. In some embodiments, a mobile operating system 470 (e.g., iOS, Android, Windows Phone, etc.) and one or more applications 480 may be loaded into the memory 460 from the storage 490 in order to be executed by the CPU 440. The applications 480 may include a browser or any other suitable mobile apps for receiving and rendering information relating to image processing or other information from the processing device 120. User interactions with the information stream may be achieved via the I/O 450 and provided to the processing device 120 and/or other components of the imaging system 100 via the network 150.

To implement various modules, units, and their functionalities described in the present disclosure, computer hardware platforms may be used as the hardware platform(s) for one or more of the elements described herein. The hardware elements, operating systems and programming languages of such computers are conventional in nature, and it is presumed that those skilled in the art are adequately familiar therewith to adapt those technologies to generate an image as described herein. A computer with user interface elements may be used to implement a personal computer (PC) or another type of work station or terminal device, although a computer may also act as a server if appropriately programmed. It is believed that those skilled in the art are familiar with the structure, programming and general operation of such computer equipment and as a result, the drawings should be self-explanatory.

Figure 5:
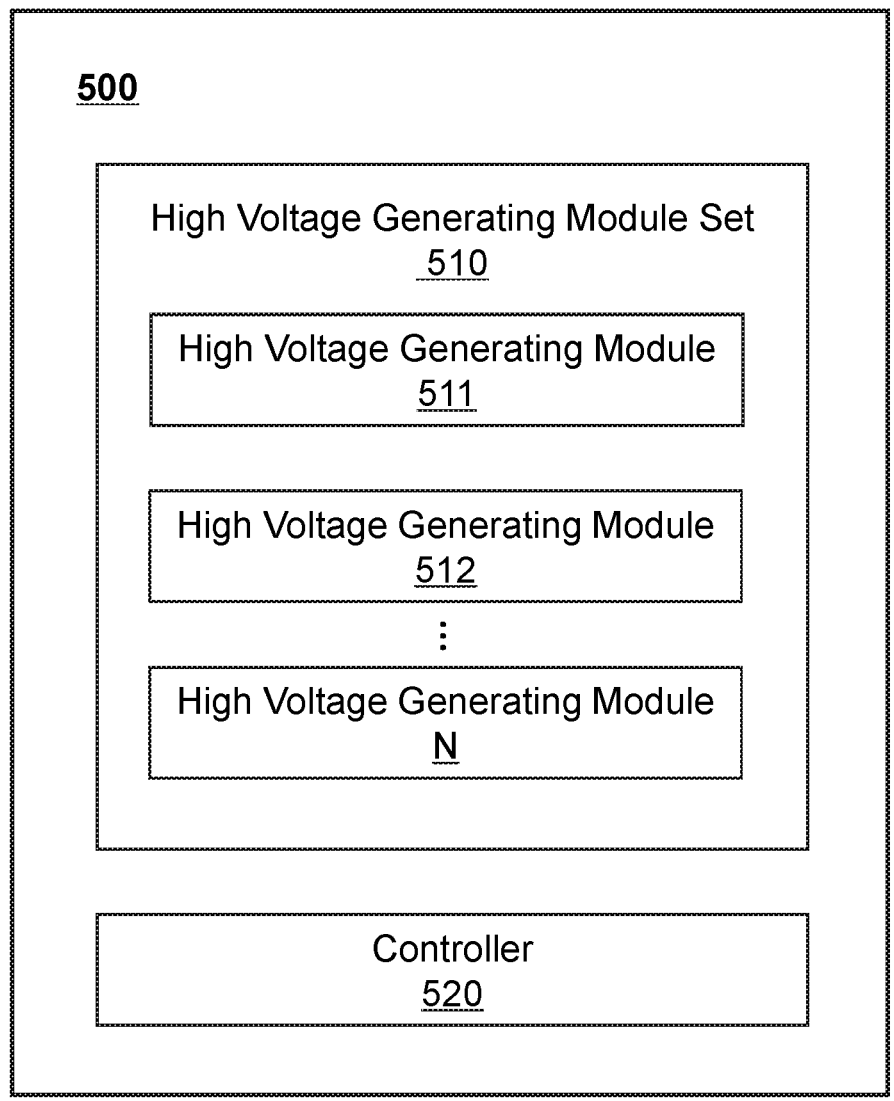
FIG. 5 is a block diagram illustrating an exemplary high voltage generator according to some embodiments of the present disclosure.

FIG. 5 is a block diagram illustrating an exemplary high voltage generator according to some embodiments of the present disclosure. As illustrated in FIG. 5, the high voltage generator 500 may include a high voltage generating module set 510 and a controller 520.

The high voltage generating module set 510 may be configured to generate and/or provide a target voltage to a load. For example, the high voltage generating module set 510 may be configured to provide a tube voltage (i.e., the target voltage) to a tube of a radiation source of a radiation device (e.g., an X-ray imaging device, an X-ray treatment device). The high voltage generating module set 510 may include multiple high voltage generating modules, e.g., a high voltage generating module 511, a high voltage generating module 512, . . . , a high voltage generating module N, etc. The count or number of the multiple high voltage generating modules may be equal to or exceed 2. The multiple high voltage generating modules may be arranged in the high voltage generator 500 in a series connection. Two adjacent high voltage generating modules in the high voltage generator 500 may be next to each other in the series connection and electrically connected. For example, the high voltage generating module 511 may be next to and electrically connected to the high voltage generating module 512 in the series connection. The high voltage generating module 512 may be next to and electrically connected to another high voltage generating module (not shown).

Each of the multiple high voltage generating modules included in the high voltage generating module set 510 may be configured to receive a driving pulse and generate a voltage. Voltages generated by the multiple high voltage generating modules may be added as a result of the series connection of the multiple high voltage generating modules to form the target voltage outputted by the high voltage generating module set 510. As used herein, a voltage generated by a high voltage generating module may also be referred to as a voltage component of the target voltage. The target voltage outputted by the high voltage generating module set 510 and provided to a load may also be referred to as a total voltage. The total voltage may be determined based on the voltage component generated by each of the multiple high voltage generating modules. For example, if a voltage component provided by each of the multiple high voltage generating modules is 20 kV and the count or number of the multiple high voltage generating modules is 4, the total voltage may be 80 kV.

Waveforms of the multiple driving pulses received by the multiple high voltage generating modules may be the same. For example, each of the multiple driving pulses may include the same rectangular waveform with the same parameters (e.g., amplitude, frequency, etc.). Time points when the multiple high voltage generating modules receive the multiple driving pulses may be different. For example, if the time points of the high voltage generating module 511, the high voltage generating module 512, . . . , the high voltage generating module N are denoted as $T_1, T_2, \ldots, T_n$, respectively, $T_1, T_2, \ldots, T_n$ may be different from each other. In some embodiments, differences between consecutive time points when two high voltage generating modules among the multiple high voltage generating modules receive the multiple driving pulses may be the same or different. For example, the time points when the multiple high voltage generating modules receive the multiple driving pulses may be arranged as a time sequence (e.g., from the earliest time point to the latest time point, or from the latest time point to the earliest time point). If the time points of the multiple high voltage generating modules are denoted by $T_1, T_2, T_3, T_4, \ldots, T_n$, respectively, and the time sequence is denoted as $(T_3, T_1, T_5, T_7, \ldots, T_k, \ldots, T_n)$, time differences between two adjacent time points in the time sequence may be the same or different. For instance, $|T_1-T_3|=|T_5-T_1|=|T_7-T_5|, \ldots$, etc. As another example, $|T_1-T_3|\neq|T_5-T_1|\neq|T_7-T_5|, \ldots$, etc., or $|T_1-T_3|=|T_5-T_1|\neq|T_7-T_5|, \ldots$, etc.

In some embodiments, the time points when the multiple high voltage generating modules receive the multiple driving pulses may be determined or set according to orders of the multiple high voltage generating modules arranged in the series connection. The multiple high voltage generating modules may receive the multiple driving pulses in turn according to the orders of the multiple high voltage generating modules arranged in the series connection. For example, a first high voltage generating module (e.g., the high voltage generating module 511) arranged as the first in the series connection may receive a first driving pulse at a first time point, a second high voltage generating module (e.g., the high voltage generating module 512) next to and connected to the first high voltage generating module may receive a second driving pulse at a second time point, a third high voltage generating module next to and connected to the second high voltage generating module may receive a third driving pulse at a third time point. In some embodiments, the first driving pulse, the second driving pulse, and the third driving pulse may be a same driving pulse generated by a driving module. In some embodiments, the first driving pulse, the second driving pulse, and the third driving pulse may be different driving pulses generated by different driving modules and waveforms of the first driving pulse, the second driving pulse, and the third driving pulse may be the same. In some embodiments, the first time point may be later than the second time point. The second time point may be later than the third time point. In some embodiments, the first time point may be earlier than the second time point. The second time point may be earlier than the third time point. In some embodiments, differences between time points when any two adjacent high voltage generating modules among the multiple high voltage generating modules receive driving pulses may be the same or different. For example, the high voltage generating module 511, the high voltage generating module 512, . . . , the high voltage generating module N may be next to each other in turn in the series connection. The time points $T_1, T_2, T_3, T_4, \ldots, T_n$, respectively corresponding to the high voltage generating module 511, the high voltage generating module 512, . . . , the high voltage generating module N receive the multiple pulses may be arranged as a time sequence (e.g., from the earliest time point to the latest time point, or from the latest time point to the earliest time point) denoted by $(T_1, T_2, T_3, T_4, \ldots, T_n)$. Time differences between two adjacent time points in the time sequence may be the same or different. For instance, $|T_2-T_1|=|T_3-T_2|=|T_4-T_3|, \ldots$, etc. As another example, $|T_2-T_1|\neq|T_3-T_2|\neq|T_4-T_3|, \ldots$, etc., or $|T_2-T_1|=|T_3-T_2|\neq|T_4-T_3|, \ldots$, etc. As a further example, a first high voltage generating module (e.g., the high voltage generating module 511) arranged as the first in the series connection may receive a first driving pulse at a first time point, a second high voltage generating module (e.g., the high voltage generating module 512) next to and connected to the first high voltage generating module may receive a second driving pulse at a second time point, and a third high voltage generating module next to and connected to the second high voltage generating module (e.g., the high voltage generating module 512) may receive a third driving pulse at a third time point. A time difference between the first time point and the second time point may be the same as or different from a time difference between the second time point and the third time point.

In some embodiments, the voltage component provided by each of the multiple high voltage generating modules may include a ripple wave and a direct voltage component. The target voltage generated by the high voltage generator 500 may be equal to a superposition of the voltage components generated by the multiple high voltage generating modules as the series connection of the multiple high voltage generating modules. In some embodiments, the total voltage may include a total ripple wave formed by a superposition of ripple waves in the voltage components generated by the multiple high voltage generating modules in which at least part of the ripple waves cancel each other. The superposition and cancellation of the ripple waves in the voltage components may be caused by phase differences between the ripple waves as a result of the different time points when the multiple high voltage generating modules receive the driving pulses of a same waveform which in turn may lead to the ripple waves of the same waveform. The total ripple wave included in the target voltage may satisfy an operational constraint. In some embodiments, the operational constraint may include that the energy of the total ripple wave included in the total voltage may be lower than a threshold. For example, the energy of the total ripple wave included in the total voltage may be lower than 3%, 4%, or 5%, etc. of the energy of the total voltage. As another example, the energy of the total ripple wave included in the total voltage may be lower than 3%, 4%, or 5%, etc. of the energy of the total direct voltage. In some embodiments, the operational constraint may include that the energy of the total ripple wave included in the total voltage may be smaller than an energy of the ripple wave included in the voltage component generated by each of the multiple high voltage generating modules. In some embodiments, the total voltage may have no ripple wave as a result of a superposition and complete cancellation of the ripple waves in the voltage components generated by the multiple high voltage generating modules. For example, if the count or number of the multiple high voltage generating modules is 3 and a sum of the phase differences between the ripple waves is equal to $2\pi$ (i.e., 360 degrees), the ripple waves may be completely canceled after the ripple waves are superposed. As used herein, a phase difference is between two ripple waves of voltage components generated by two high voltage generating modules receiving driving pulses at two consecutive time points or between two ripple waves of voltage components generated by a high voltage generating module arranged as first in the series connection and another high voltage generating module. A phase difference between two ripple waves of voltage components generated by two high voltage generating modules receiving driving pulses at two consecutive time points may be associated with a time difference between the two consecutive time points and a period of the driving pulses (i.e., pulse modulation period). More descriptions for the phase difference, a time difference between two consecutive time points, and a period of the driving pulses may be found in FIG. 6 and the descriptions thereof.

In some embodiments, a specific high voltage generating module may include an inverter circuit, a high voltage generating unit, and a rectifier. The inverter circuit may be configured to convert a direct voltage provided by a power unit into an alternating voltage in response to receipt of a driving pulse generated by the controller 520. For example, the inverter circuit may receive the driving pulse generated by one of the multiple driving modules included in the controller 520 and convert the direct voltage provided by the power module into an alternating voltage. The high voltage generating unit may be configured to increase the alternating voltage to obtain an increased alternating voltage. The rectifier may be configured to convert the increased alternating voltage into a voltage component. In some embodiments, the specific high voltage generating module may further include a resonant circuit configured to perform a filtering operation on the alternating voltage. In some embodiments, the specific high voltage generating module may further include a filter circuit unit configured to process the voltage component to obtain or output a steady direct voltage.

The controller 520 may be configured to control or direct the high voltage generating module set 510 to generate and/or provide a target voltage to a load (e.g., a radiation source). For example, the controller 520 may direct the high voltage generating module set 510 to generate a tube voltage switching between a high voltage and a low voltage according to a reference waveform. The controller 520 may include one or more driving modules each of which may be configured to generate one or more driving pulses. Each of the one or more driving modules may be operably connected with at least one of the multiple high voltage generating modules. A driving pulse generated by a driving module may be configured to drive a high voltage generating module to generate a voltage component in response to receipt of the driving pulse.

In some embodiments, the controller 520 may include one single driving module. The one single driving module may be configured to generate one or more driving pulses and transmit each of the multiple driving pulses to at least one of the multiple higher voltage generating module. For example, the one single driving module may generate a driving pulse and transmit the driving pulse to each of the multiple high voltage generating modules. As another example, the one single driving module may generate a driving pulse and transmit the driving pulse to a portion of the multiple high voltage generating modules. As still another example, the one single driving module may generate multiple driving pulses and transmit each of the multiple driving pulses to at least one of the multiple high voltage generating modules.

In some embodiments, the controller 520 may include multiple driving modules each of which is operably connected to at least one of the multiple high voltage generating modules. Each of the multiple driving modules may be configured to generate a driving pulse and transmit the driving pulse to the at least one of the multiple high voltage generating modules that is operably connected to each of the multiple driving modules. For example, each of the multiple driving modules may be operably connected to one of the multiple high voltage generating modules. As another example, each of a portion of the multiple driving modules may be operably connected to two or more of the multiple high voltage generating modules. In other words, the count or number of driving modules included in the controller 520 may be less than or equal to the count or number of the multiple high voltage generating modules. In some embodiments, the multiple driving modules may transmit the multiple driving pulses at different time points, such that the multiple high voltage generating modules may receive the multiple driving pulses at different time points. Differences between consecutive time points when two driving modules transmit the two of the multiple driving pulses may be the same or different. For example, the time points when the multiple driving modules transmit the multiple driving pulses to the multiple high voltage generating modules 511, 512, ..., N may be $T_1'$, $T_2'$, $T_n'$, respectively. The time points when the multiple driving modules transmit the multiple driving pulses may be arranged as a time sequence (e.g., from the earliest time point to the latest time point, or from the latest time point to the earliest time point) as $T_3'$, $T_1'$, $T_5'$, $T_7'$, ..., $T_n'$), and $|T_1'-T_3'|=|T_5'-T_1'|=|T_7'-T_5'|$, ..., etc., or $|T_1'-T_3'|\neq|T_5'-T_1'|\neq|T_7'-T_5'|$, ..., etc. More descriptions for a driving module may be found elsewhere in the present disclosure (e.g., FIG. 6 and the descriptions thereof).

It should be noted that the above description is merely provided for the purposes of illustration, and not intended to limit the scope of the present disclosure. Apparently, for persons having ordinary skills in the art, multiple variations and modifications may be conducted under the teachings of the present disclosure. However, those variations and modifications do not depart from the scope of the present disclosure. For example, the inverter circuit and the resonant circuit may be integrated into one single circuit unit. As another example, the high voltage generating module set 510 may include multiple power modules each of which may be configured to provide power to at least one of the multiple high voltage generating modules.

FIG. 6 is a schematic diagram illustrating an exemplary high voltage generator according to some embodiments of the present disclosure. As illustrated in FIG. 6, the high voltage generator 600 may include a high voltage generating module set 610 and a driving module 620. The high voltage generating module set 610 may include N multiple high voltage generating modules (e.g., a high voltage generating module 1, a high voltage generating module 2, a high voltage generating module 3, ..., a high voltage generating module N). N may be equal to or exceed 2. The high voltage generator 600 may be configured to provide a voltage and/or current to a load. The load may include a radiation source (e.g., an X-ray tube) of an imaging device or a treatment device or any other load, such as a resistance, an inductor, etc. For example, the high voltage generator 600 may provide a tube voltage and/or tube current for a radiation source (e.g., the radiation source 115), and/or provide power for other components of the radiation source. As another example, the high voltage generator 600 may provide a tube voltage switching between a high voltage and a low voltage to a radiation source (e.g., the radiation source 115) of an X-ray imaging device.

The driving module 620 may be configured to generate a driving pulse and transmit the driving pulse to each of the N high voltage generating modules. Each of the N high voltage generating modules may receive the driving pulse and generate a voltage component according to the driving pulse. The N high voltage generating modules may be in a series connection to provide a target or total voltage that includes a sum or superposition of N voltage components to the load (e.g., a tube of a radiation source). For example, if a voltage component provided by each of the N high voltage generating modules is 20 kV, the count or number of the N high voltage generating modules 610 is 4, the total voltage may be 80 kV. The waveforms of driving pulses received by the N high voltage generating modules may be the same. In some embodiments, the driving pulse may include a rectangular waveform with a modulation period (i.e., pulse modulation period).

In some embodiments, the driving module 620 may include a signal conditioner, a driving pulse generating unit, a power amplifier, a signal driving unit, or the like, or any combination thereof. The signal conditioner may be configured to filter and/or limit electrical signals fed back by each of the N high voltage generating modules, and transmit the filtered and/or limited electrical signals to the driving pulse generating unit (e.g., a closed-loop feedback controller). An electrical signal may include electrical parameters such as voltage, current, etc. The driving pulse generating unit may be configured to generate the driving pulse based on the electrical signal output by the signal conditioner and an operational constraint associated with a ripple wave included in the total voltage generated by the high voltage generator 600. The driving pulse generating unit may modulate the driving pulse using a pulse modulation technique. In some embodiments, the pulse modulation technique may include a pulse width modulation (PWM), a pulse frequency modulation (PFM), a pulse density modulation (PDM), a pulse amplitude modulation (PAM), a pulse position modulation (PPM), a pulse code modulation (PCM), or the like, or any combination thereof. The power amplifier may be configured to amplify the generated driving pulse. The signal driving unit may be configured to transmit the amplified driving pulse to each of the N high voltage generating modules.

Merely for illustration, only one single driving module 620 is described in the high voltage generator 600. However, it should be noted that the high voltage generator 600 in the present disclosure may also include multiple driving modules. Thus driving pulses that are provided by one driving module as described in the present disclosure may also be jointly or separately provided by the multiple driving modules. For example, each of the N high voltage generating modules may be operably connected to one driving module 620, i.e., a count or number of the high voltage generating module 610 may be the same as a count or number of driving modules. As another example, one driving module may be connected with two or more of the N high voltage generating modules, i.e., the count or number of the N high voltage generating modules may be greater than the count or number of the driving modules.

Time points when the N high voltage generating modules receive the driving pulses may be different. For example, the time points when the N high voltage generating modules 1, 2, ..., K, ..., N receive the driving pulses may be denoted as $T_1$, $T_2$, ..., $T_k$, ..., $T_n$, respectively. $T_1$, $T_2$, ..., $T_k$, ..., $T_n$ may be different from each other. In some embodiments, the N high voltage generating modules (i.e., the high voltage generating module 1, the high voltage generating module 2, ..., the high voltage generating module K, ..., the high voltage generating module N) may be arranged in the high voltage generator 600 in sequence from first to Nth. For example, the high voltage generating module 1 may be arranged in the series connection as the first one which may be connected electrically with an anode of a tube of a radiation source. The high voltage generating module N may be arranged in the series connection as the last one which may be connected electrically with a cathode of the tube of the radiation source. The high voltage generating module 2 may be next to and electrically connected to the high voltage generating module 1 in the series connection. The high voltage generating module N may be next to and electrically connected to the high voltage generating module N-1 (not shown) in the series connection. The time points of the N ordered high voltage generating modules from first to Nth may delay a time difference sequentially. For example, the time point of the high voltage generating module 2 may be delayed a first time difference with respect to the high voltage generating module 1. The time point of a high voltage generating module 3 (not shown) may be delayed a second time difference with respect to the high voltage generating module 2. The time point of the high voltage generating module N may be delayed an (N-1)th time difference with respect to the high voltage generating module N-1. As another example, the time point of the high voltage generating module 2 may be earlier than the time point the high voltage generating module 1 with a first time difference. The time point of the high voltage generating module 3 may be earlier than the time point the high voltage generating module 2 with a second time difference. The time point of the high voltage generating module N may be earlier than the time point the high voltage generating module N-1 with an (N-1)th time difference. The first time difference, the second time difference, . . . , and the (N-1)th time difference may be the same or different.

In some embodiments, differences between consecutive time points when any two high voltage generating modules among the N high voltage generating modules receive driving pulses may be the same or different. For example, the time points of the N high voltage generating modules 1, 2, . . . , K, . . . , N may be $T_1, T_2, \ldots, T_k, \ldots, T_n$, respectively. The time points when the N high voltage generating modules receive the driving pulses may be arranged as a time sequence (e.g., from the earliest time point to the latest time point, or from the latest time point to the earliest time point) as $T_3, T_1, T_5, T_7 \ldots, T_k, \ldots, T_n$, and $|T_1-T_3|=|T_5-T_1|=|T_7-T_5|, \ldots$, etc., or $|T_1-T_3|\neq|T_5-T_1|\neq|T_7-T_5|, \ldots$, etc., or $|T_1-T_3|\neq|T_5-T_1|=|T_7-T_5|, \ldots$, etc. The time points arranged in the time sequence may be consecutive. As used herein, two consecutive time points may refer to two adjacent time points that there are no other time points between the two consecutive time points.

The voltage component generated by each of the N high voltage generating modules may include a direct voltage component and/or a ripple wave. As used herein, a ripple wave may also be referred to as an alternating voltage component in the voltage component caused by incomplete suppression of alternating waveforms after rectification. The ripple wave may include a frequency, an energy (or amplitude), a phase, or the like, or any combination thereof. Phases of ripple waves in the N voltage components (or the total voltage) generated by the N high voltage generating modules may be different due to the different time points when the N high voltage generating modules receive the driving pulses. For example, a difference between the phase of the ripple wave included in the kth voltage component generated by the high voltage generating module K and the phase of the ripple wave included in the first voltage component generated by the high voltage generating module 1 may be determined according to $$\left|\frac{(T_k - T_1)\times 4\pi}{T_s}\right|,$$

wherein $T_s$ may refer to a modulation period of the driving pulse. When the voltage components generated by the N high voltage generating modules are superposed to form the target voltage as a result of the series connection of the N high voltage generating modules, the ripple waves included in the voltage components may be superimposed and partially or completely canceled as a result of differences between phases of the ripple waves, which may reduce energy of a total ripple wave in the total voltage. For example, the total voltage generated by the N high voltage generating modules may include the total direct voltage without a total ripple wave as the complete cancellation of the ripple waves. As another example, the total voltage generated by the N high voltage generating modules may include a total direct voltage and/or a total ripple wave as the partial cancellation of the ripple waves. In some embodiments, the energy of the total ripple wave in the total voltage may satisfy an operational constraint. The operational constraint may include that the energy of the total ripple wave is smaller than a threshold. The operational constraint may be a default setting of the high voltage generator 600. For example, the energy of the total ripple wave may be smaller than 3% of the energy of the total direct voltage in the total voltage. As another example, the energy of the total ripple wave may be smaller than 3% of the energy of the total voltage.

In some embodiments, differences between time points when any two adjacent high voltage generating modules among the N high voltage generating modules receive the driving pulses may be determined based on the operational constraint. For example, if the high voltage generating module set 610 includes the high voltage generating module 1, the high voltage generating module 2, and the high voltage generating module 3 (not shown) that are electrically connected in sequence. The high voltage generating module 1 may be next to and electrically connected to the high voltage generating module 2. The high voltage generating module 2 may be next to and electrically connected to the high voltage generating module 3 (not shown). The high voltage generating module 1 may receive a first driving pulse at a first time point $T_1$, the high voltage generating module 2 may receive a second driving pulse at a second time point $T_2$, and the high voltage generating module 3 may receive a third driving pulse at a third time point $T_3$. The modulation period of each of the three high voltage generating modules may be $T_s$. The operational constraint may include that an energy of the total ripple wave included in the total voltage is equal to 0. The difference between time points (i.e., $|T_3-T_2|$, or $|T_2-T_1|$) when any two adjacent high voltage generating modules receive the driving pulses may be determined based on the Equation (1) as follows:

$$\frac{|T_3 - T_1|\times 4\pi}{T_s} + \frac{|T_2 - T_1|\times 4\pi}{T_s} = 2\pi. \tag{1}$$

In some embodiments, a value of $|T_3|T_1|$ may be two times of a value of $|T_2-T_1|$ due to differences between time points when any two adjacent high voltage generating modules among the three high voltage generating modules receive driving pulses are the same, i.e., $|T_2-T_1|=|T_3-T_2|$. The differences between time points when any two adjacent high voltage generating modules receive the driving pulses may be determined as $$\frac{T_s}{6}$$

according to Equation (1).

In some embodiments, a specific high voltage generating module may include a power unit, an inverter circuit, a resonant circuit, a high voltage generating unit, and a rectifier-filter circuit. For a purpose for illustration, the high voltage generating module 1 may be taken as an example here. The high voltage generating module 1 may include a power unit 1-1, an inverter circuit 1-2, a resonant circuit 1-3, a high voltage generating unit 1-4, and a rectifier-filter circuit (or referred to as rectifier for brevity) 1-5. The power unit 1-1 may be configured to provide a direct voltage and/or current to the inverter circuit 1-2 (or the specific high voltage generating module). In some embodiments, the power unit 1-1 may include a current source, a voltage source, or the like, or a combination thereof. In some embodiments, the power unit 1-1 may include one or more diodes, one or more inductors (e.g., coils), and one or more capacitors, or the like, or any combination thereof. In some embodiments, two or more of the N high voltage generating modules may share one single power unit. For example, the high voltage generator 600 may have one power unit configured to power for all the N high voltage generating modules. More descriptions for the power unit 1-1 may be found elsewhere in the present disclosure (e.g., FIG. 7 and the descriptions thereof).

The inverter circuit 1-2 may be configured to convert the direct voltage provided by the power unit 1-1 into an alternating voltage in response to receipt of the driving pulse generated by the driving module 620. The driving pulse received by the inverter circuit 1-2 may drive switches included in the inverter circuit 1-2 to generate the alternating voltage according to the driving pulse. In some embodiments, time points when inverter circuits included in the N high voltage generating modules receive the driving pulses may be in a time sequence (e.g., from the earliest time point to the latest time point, or from the latest time point to the earliest time point) as $T_1, T_2, \ldots, T_k, \ldots, T_n$. Differences between a phase of the ripple wave included in the kth voltage component generated by the kth high voltage generating module (i.e., k) and a phase of the ripple wave included in the first voltage component generated by a first high voltage generating module (i.e., the high voltage generating module 1) may be $$\left| \frac{(T_k - T_1) \times 4\pi}{T_s} \right|,$$

wherein $T_s$ may refer to a modulation period of a driving pulse received by the inverter circuit 1-2. The modulation period of a driving pulse may also be referred to as a modulation period of switches of inverter circuit 1-2. For ripple waves included in the N voltage components, the ripple waves may be superimposed and canceled based on the differences between phases of the ripple waves when two or more of the N high voltage generating modules are connected in series, which may reduce the energy of the total ripple wave in the total voltage. More descriptions for the inverter circuit may be found elsewhere in the present disclosure (e.g., FIG. 8 and the descriptions thereof).

The resonant circuit 1-3 may be configured to perform a filtering operation on the alternating voltage. The filtering operation on the alternating voltage may satisfy an impedance requirement of the high voltage generating unit 1-4 and improve the operating efficiency of the switches included in the inverter circuit 1-2. In some embodiments, the resonant circuit 1-3 may include one or more capacitive elements (e.g. capacitors) and one or more inductive elements (i.e., inductors, e.g., coils). In some embodiments, the capacitive element may be represented by the letter C, and the inductive element may be represented by the letter L. The resonant circuit 1-3 may include a parallel LC circuit unit, a series LC circuit unit, a series-parallel LCC circuit unit, a series-parallel LLC circuit unit, or the like, or any combination thereof. In some embodiments, the resonant circuit 1-3 may be omitted from each of the N high voltage generating modules. In some embodiments, the resonant circuit 1-3 may be integrated into the inverter circuit 1-2 or the high voltage generating unit 1-4.

The high voltage generating unit 1-4 may be configured to increase the alternating voltage generated by the inverter circuit 1-2 to obtain an increased alternating voltage. In some embodiments, the high voltage generating unit 1-4 may include a transformer consisting of a primary winding connected with the inverter circuit 1-2 (or the resonant circuit 1-3), a secondary winding connected with the rectifier 1-5 and a magnetic core (or iron core). The number of turns of the secondary winding may be greater than the number of turns of the primary winding. The primary winding and the secondary winding may be wounded around the magnetic core (or iron core). Under the input of the power unit 1-1, the alternating voltage (i.e., a primary alternating voltage) provided by the inverter circuit 1-2 (or the resonant circuit 1-3) may be provided to the primary winding and produce an alternating magnetic flux. According to the principle of electromagnetic induction, the alternating magnetic flux may generate an electromotive force (i.e., a secondary alternating voltage) in the secondary winding by induction. As the number of turns of the secondary winding is greater than the number of turns of the primary winding, the obtained secondary alternating voltage provided by the secondary winding may be higher than the primary alternating voltage provided to the primary winding, i.e., the increased alternating voltage may be obtained.

The rectifier 1-5 may be configured to convert the increased alternating voltage into the voltage component. The rectifier in each of the N high voltage generating modules may be in a series connection. The total voltage generated by the high voltage generator 600 may be equal to a superposition of voltage components generated by the N high voltage generating modules. In some embodiments, the rectifier 1-5 may include a bridge rectifier circuit, a half-wave rectifier circuit, a full-wave rectifier circuit, or the like, or any combination thereof. In some embodiments, the rectifier 1-5 may include an electronic filter. The electronic filter may be configured to process the voltage component to obtain or output a steady direct voltage. In some embodiments, the electronic filter may include one or more capacitors, one or more chokes, etc. More descriptions for the rectifier 1-5 may be found elsewhere in the present disclosure (e.g., FIG. 9 and the descriptions thereof).

It should be noted that the above description is merely provided for the purposes of illustration, and not intended to limit the scope of the present disclosure. Apparently, for persons having ordinary skills in the art, multiple variations and modifications may be conducted under the teachings of the present disclosure. However, those variations and modifications do not depart from the scope of the present disclosure. For example, the inverter circuit 1-2 and the resonant circuit 1-3 may be integrated into a single unit. As another example, some other components/units may be added into the high voltage generator 600, such as a controller.

Figure 7:
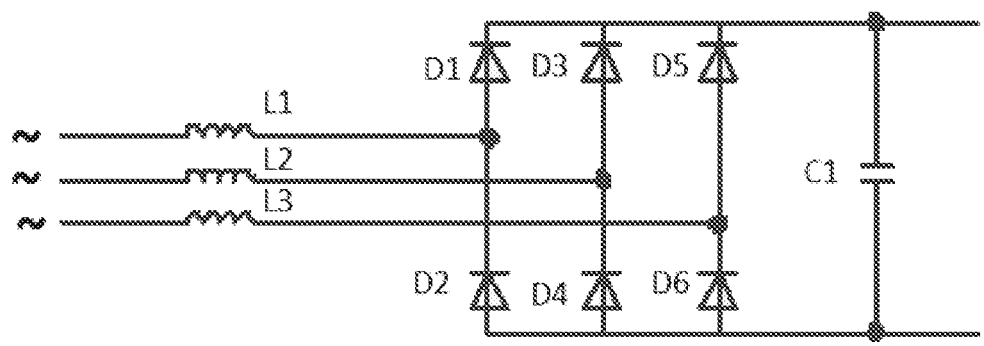
FIG. 7 is a diagram illustrating an exemplary power unit according to some embodiments of the present disclosure.

FIG. 7 is a diagram illustrating an exemplary power unit according to some embodiments of the present disclosure. As shown in FIG. 7, the power unit 700 may be powered by a three-phase alternating voltage source. The power unit 700 may include a plurality of diodes (e.g., diodes D1, D2, D3, D4, D5, and D6), a capacitor C1, and multiple inductors (e.g., coils L1, L2, and L3). The diode D1 and the diode D2 may be in a series connection, the diode D3 and the diode D4 may be in a series connection, and the diode D5 and the diode D6 may be in a series connection. The diode D1 and the diode D2, the diode D3 and the diode D4, the diode D5 and the diode D6 are connected in parallel with the capacitor C1, respectively. The power unit 700 may include three input interfaces. The three input interfaces may be connected with connected points of the diode D1 and the diode D2, the diode D3 and the diode D4, the diode D5 and the diode D6, respectively.

FIG. 8 is a diagram illustrating an exemplary inverter circuit according to some embodiments of the present disclosure. As shown in FIG. 8, the inverter circuit 800 may include multiple diodes (e.g., diodes D7, D8, D9, and D10) and multiple switches (e.g., switches K1, K2, K3, and K4). Each of the multiple diodes may be connected in parallel with one of the multiple switches. For example, the switch K1 may be connected in parallel with the diode D7, the switch K2 may be connected in parallel with the diode D8, the switch K3 may be connected in parallel with the diode D9, and the switch K4 may be connected in parallel with the diode D10. The switch K1 and the switch K2 may be in a series connection, and the switch K3 and the switch K4 may be in a series connection. The switch K1 and the switch K2 may be connected in parallel with the switch K3 and the switch K4.

Figure 9:
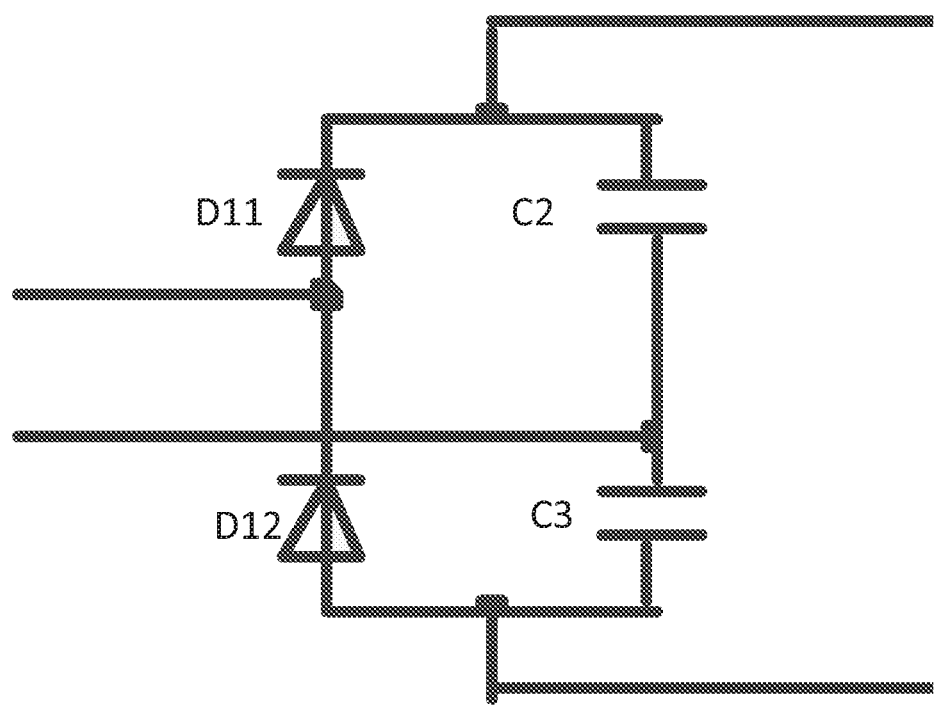
FIG. 9 is a diagram illustrating an exemplary rectifier-filter circuit according to some embodiments of the present disclosure.

FIG. 9 is a diagram illustrating an exemplary rectifier-filter circuit according to some embodiments of the present disclosure. As shown in FIG. 9, the rectifier-filter circuit 900 may include a diode D11, a diode D12, a capacitor C2, and a capacitor C3. The diode D11 and the diode D12 may be in a series connection. The capacitor C2 and the capacitor C3 may be in a series connection. The diode D11 and the diode D12 may be connected in parallel with the capacitor C2 and the capacitor C3.

Figure 10:
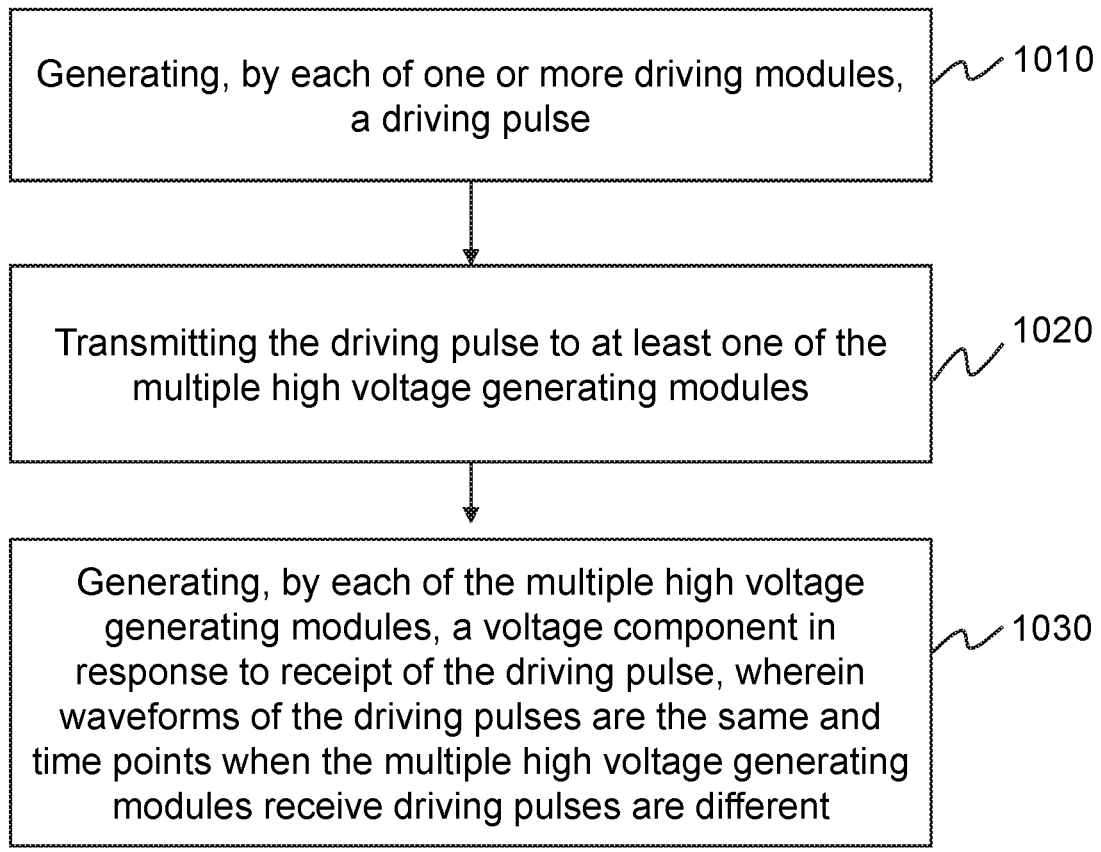
FIG. 10 is a schematic flowchart illustrating an exemplary process for generating a voltage including multiple voltage components according to some embodiments of the present disclosure.

FIG. 10 is a schematic flowchart illustrating an exemplary process for generating a voltage including multiple voltage components according to some embodiments of the present disclosure. In some embodiments, process 1000 may be implemented by at least portion of the imaging system 100. For example, the process 1000 may be implemented by the imaging device 110 and/or the processing device 120.

In 1010, a driving pulse may be generated by each of one or more driving modules. In some embodiments, the one or more driving modules may be implemented on a controller (e.g., the controller 520 illustrated in FIG. 5) of a high voltage generator. In some embodiments, a driving module may include a signal conditioner, a driving pulse generating unit, a power amplifier, a signal driving unit, or the like, or any combination thereof. More descriptions for the driving module may be found elsewhere in the present disclosure (e.g., FIGS. 5 and 6 and the descriptions thereof). A driving pulse may be used to drive one or more high voltage generating modules who receive the driving pulse to generate an alternating voltage based on a power supply. In some embodiments, the driving pulse generated by the controller may be a wave (e.g., a carrier wave). The wave may include a rectangular waveform, a sinusoidal waveform, etc. The wave may be defined by one or more parameters, such as frequency, amplitude, period, phase, width, etc. The controller may modulate the driving pulse using a pulse modulation technique. Exemplary pulse modulation techniques may include a pulse width modulation (PWM), a pulse frequency modulation (PFM), a pulse density modulation (PDM), a pulse amplitude modulation (PAM), a pulse position modulation (PPM), a pulse code modulation (PCM), or the like, or any combination thereof. In some embodiments, the controller of the high voltage generator may cause the driving module to generate the driving pulse in response to the receipt of an exposure instruction from the processing device 120 or the terminal 140. The waveform and parameters of the driving pulse may be default settings of the imaging system 100.

In 1020, the driving pulse may be transmitted to at least one of multiple high voltage generating modules. In some embodiments, the controller may include one single driving module. The one single driving module may be configured to generate the driving pulse and transmit the driving pulse to each of the multiple higher voltage generating modules. For example, the one single driving module may generate a driving pulse and transmit the driving pulse to each of the multiple high voltage generating modules. In some embodiments, the one single driving module may transmit simultaneously the driving pulse to each of the multiple high voltage generating modules at a same time point. The multiple high voltage generating modules may receive the driving pulse at different time points. For example, the driving pulse (also referred to as a first driving pulse may be received by a first high voltage generating module at a first time point. The driving pulse (also referred to as a second driving pulse may be received by a second high voltage generating module at a second time point. The driving pulse (also referred to as a third driving pulse may be received by a third high voltage generating module at a third time point. The first time point may be later than (or earlier than) the second time point. The second time point may be later than (or earlier than) the first time point. A time difference between the first time point and the second time point and a time difference between the second time point and the third time point may be the same or different. In some embodiments, the second high voltage generating module may be next to and electrically connected to the first high voltage generating module. The third high voltage generating module may be next to and electrically connected to the second high voltage generating module.

In some embodiments, the controller may include multiple driving modules. Each of the multiple driving modules may be configured to generate the driving pulse and transmit the driving pulse to at least one of the multiple high voltage generating modules that is operably connected to each of the multiple driving modules. For example, each of the multiple driving modules may be operably connected to one of the multiple high voltage generating modules. As another example, each of a portion of the multiple driving modules may be operably connected to two or more of the multiple high voltage generating modules. In other words, the count or number of driving modules included in the controller may be less than or equal to the count or number of the multiple high voltage generating modules. In some embodiments, the multiple driving modules may transmit the multiple driving pulses at different time points, such that the multiple high voltage generating modules may receive the multiple driving pulses at different time points. Differences between consecutive time points when two driving modules transmit the two of the multiple driving pulses may be the same or different. In some embodiments, the multiple driving modules may transmit simultaneously the driving pulses to the multiple high voltage generating modules at a same time point. The multiple high voltage generating modules may receive the driving pulses at different time points. For example, time points when the multiple high voltage generating modules receive the driving pulses may be $T_1, T_2, \ldots, T_k, \ldots, T_n$ (K=, 2, 3, 4, . . . , N), respectively, wherein $T_1, T_2, \ldots, T_k, \ldots, T_n$ may be different from each other. In some embodiments, differences between consecutive time points when two high voltage generating modules among the multiple high voltage generating modules receive the driving pulses may be the same or different. In some embodiments, differences between time points when any two adjacent high voltage generating modules among the multiple high voltage generating modules receive driving pulses may be the same or different. More descriptions for time points associated with when the multiple high voltage generating modules receive the driving pulses may be found elsewhere in the present disclosure (e.g., FIGS. 5 and 6 and the descriptions thereof).

In 1030, a voltage component of the voltage may be generated by each of the multiple high voltage generating modules in response to receipt of the driving pulse. The voltage component may include a direct voltage component and/or a ripple wave. As used herein, a ripple wave may be referred to as an alternating voltage component in the voltage component caused by incomplete suppression of alternating waveforms after rectification. The ripple wave may include one or more parameters, such as frequency, energy (or amplitude), a phase, or the like, or any combination thereof. Phases of ripple waves in multiple voltage components generated by the multiple high voltage generating modules may be different due to the different time points when the multiple high voltage generating modules receive the driving pulses.

The multiple high voltage generating modules may be in a series connection to provide a total voltage. The total voltage may include a total direct voltage and/or a total ripple wave. The total direct voltage may be equal to a superposition of the voltage components generated by the multiple high voltage generating modules as the series connection of the multiple high voltage generating modules. The total ripple wave may be generated as a superimposition of the multiple ripple waves included in the multiple voltage components. The total ripple wave included in the target voltage may satisfy an operational constraint. In some embodiments, the operational constraint may include that the energy of the total ripple wave included in the total voltage may be lower than a threshold. For example, the energy of the total ripple wave included in the total voltage may be lower than 3%, 4%, or 5%, etc. of the energy of the total voltage. As another example, the energy of the total ripple wave included in the total voltage may be lower than 3%, 4%, or 5%, etc. of the energy of the total direct voltage. In some embodiments, the operational constraint may include that the energy of the total ripple wave included in the total voltage may be smaller than an energy of the ripple wave included in the voltage component generated by each of the multiple high voltage generating modules. In some embodiments, the total voltage may have no ripple wave as a result of a superposition and complete cancellation of the ripple waves in the voltage components generated by the multiple high voltage generating modules. For example, if the count or number of the multiple high voltage generating modules is 3 and a sum of the phase differences between the ripple waves is equal to $2\pi$ (i.e., 360 degrees), the ripple waves may be completely canceled after the ripple waves are superposed.

In some embodiments, the total voltage may be provided to a radiation source of a radiation device (e.g., an X-ray imaging device) switching between a low voltage and a high voltage. The radiation source (e.g., a tube) may generate radiation rays under the total voltage (i.e., a tube voltage). If the radiation device includes an imaging device (e.g., a CT scanner), the radiation device may absorb the energy of at least a portion of the generated radiation rays (e.g., X rays) when the at least a portion of the radiation rays (e.g., $\gamma$ ray) impinge on one or more detectors of the radiation device. Further, the one or more detectors may convert the visible light signals into electrical signals (i.e., the projection data). The projection data may indicate an attenuation (i.e., CT values) of at least a portion of the radiation rays passing through the subject. In some embodiments, the projection data may include a first portion and a second portion. The first portion of the projection data may correspond to a high-energy projection. The first portion of the projection data corresponding to the high-energy projection may refer to that the first portion of the projection data may be generated by the one or more detectors via receiving radiation rays corresponding to the high voltage. The second portion of the projection data may correspond to the low-energy projection. The second portion of the projection data corresponding to the low-energy projection may refer to that the second portion of the projection data may be generated by the one or more detectors via receiving radiation rays corresponding to the low voltage.

The first portion and the second portion of the projection data may be used in a multi-energy spectral imaging technique, such as a dual-energy subtraction technique, etc. For example, the processing device 120 may designate multiple groups of weights to the first portion of the projection data and the second portion of the projection data. Each group of the multiple groups of weights may include a first weight to the first portion of the projection data and a second weight to the second portion of the projection data. The processing device 120 may reconstruct a series of weighted average images using an image reconstruction algorithm by weighting the first portion of the projection data and the second portion of the projection using the first weight and the second weight, respectively. The processing device 120 may reconstruct a high-energy image based on the first portion of the projection data and a low-energy image based on the second portion of the projection data using an image reconstruction algorithm. The processing device 120 may perform a dual-energy analysis operation on the series of weighted average images, the high-energy image, and/or the low-energy image. In some embodiments, the dual-energy analysis operation may include using an image optimization algorithm, a non-linear blending algorithm, etc., to obtain one or more monoenergetic images. In some embodiments, the dual-energy analysis operation may include using a differentiation algorithm to identify or differentiate certain materials or substances of the subject. In some embodiments, the dual-energy analysis operation may include using a quantification algorithm to quantify one or more substances of the subject. Exemplary image reconstruction algorithms may include using an iterative reconstruction model, a Fourier slice theorem model, a fan-beam reconstruction model, an analytic reconstruction model, an algebraic reconstruction technique (ART), a simultaneous algebra reconstruction technique (SART), a Feldkamp-Davis-Kress (FDK) reconstruction model, or the like, or any combination thereof.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, one or more operations may be omitted and/or one or more additional operations may be added. For example, the operation 1010, the operation 1020, and the operation 1030 may be combined into a single operation to receiving the driving pulse. As another example, one or more other optional operations (e.g., a storing operation) may be added elsewhere in the process 1000. In the storing operation, information and/or data (e.g., the driving pulse, the voltage component, the total voltage, etc.) associated with the high voltage generator may be stored in a storage device (e.g., the storage device 130) disclosed elsewhere in the present disclosure.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer-readable media having computer-readable program code embodied thereon.

A non-transitory computer-readable signal medium may include a propagated data signal with computer readable program code embodied therein, for example, in baseband or as part of a carrier wave. Such a propagated signal may take any of a variety of forms, including electromagnetic, optical, or the like, or any suitable combination thereof. A computer-readable signal medium may be any computer-readable medium that is not a computer-readable storage medium and that may communicate, propagate, or transport a program for use by or in connection with an instruction execution system, apparatus, or device. Program code embodied on a computer-readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object-oriented programming language such as Java, Scala, Smalltalk, Eiffel, JADE, Emerald, C++, C#, VB. NET, Python or the like, conventional procedural programming languages, such as the "C" programming language, Visual Basic, Fortran, Perl, COBOL, PHP, ABAP, dynamic programming languages such as Python, Ruby, and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software-only solution, e.g., an installation on an existing server or mobile device.

Similarly, it should be appreciated that in the foregoing description of embodiments of the present disclosure, various features are sometimes grouped together in a single embodiment, figure, or description thereof to streamline the disclosure aiding in the understanding of one or more of the various inventive embodiments. This method of disclosure, however, is not to be interpreted as reflecting an intention that the claimed object matter requires more features than are expressly recited in each claim. Rather, inventive embodiments lie in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate" or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

We claim:

1. A high voltage generator, comprising:
   multiple high voltage generating modules configured to provide a total voltage, each of the multiple high voltage generating modules being configured to receive a driving pulse and generate a voltage component of the total voltage according to the driving pulse; and
   at least one driving module configured to generate the driving pulse, wherein the at least one driving module comprises:
      a signal conditioner configured to filter or limit electrical signals fed back by each of the multiple high voltage generating modules;
      a driving pulse generating unit configured to generate an initial driving pulse based on an electrical signal output by the signal conditioner and an operational constraint associated with a ripple wave included in the total voltage;
      a power amplifier configured to amplify the initial driving pulse; and
      a signal driving unit configured to transmit the amplified initial driving pulse to each of the multiple high voltage generating modules;
   wherein the multiple high voltage generating modules are in a series connection, time points when the multiple high voltage generating modules receive driving pulses are different, and waveforms of the driving pulses are the same.

2. The high voltage generator of claim 1,
   wherein the at least one driving module is further configured to transmit the driving pulse to each of the multiple high voltage generating modules.

3. The high voltage generator of claim 1, wherein the at least one driving module includes multiple driving modules each of which is operably connected to one of the multiple high voltage generating modules and configured to generate the driving pulse and transmit the driving pulse to the one of the multiple high voltage generating modules.

4. The high voltage generator of claim 1, wherein an energy of a total ripple wave included in the total voltage is lower than a threshold, the total ripple wave being formed by a superposition of ripple waves included in voltage components generated by the multiple high voltage generating modules, and wherein the threshold is no greater than 3%.

5. The high voltage generator of claim 1, wherein an energy of a total ripple wave included in the total voltage is smaller than an energy of a ripple wave included in the voltage component generated by each of the multiple high voltage generating modules, the total ripple wave being formed by a superposition of ripple waves included in voltage components generated by the multiple high voltage generating modules.

6. The high voltage generator of claim 1, wherein differences between consecutive time points when two high voltage generating modules among the multiple high voltage generating modules receive driving pulses consecutively are the same or different.

7. The high voltage generator of claim 1, wherein differences between time points when two adjacent high voltage generating modules among the multiple high voltage generating modules receive driving pulses are the same or different, the two adjacent high voltage generating modules are next to each other in the series connection and electrically connected.

8. The high voltage generator of claim 1, wherein the multiple high voltage generating modules includes a first high voltage generating module, a second high voltage generating module, and a third high voltage generating module, the first high voltage generating module is configured to receive the driving pulse at a first time point, the second high voltage generating module is configured to receive the driving pulse at a second time point, the third high voltage generating module is configured to receive the driving pulse at a third time point, a difference between the first time point and the second time point is the same as or different from a difference between the second time point and the third time point.

9. The high voltage generator of claim 8, wherein the second high voltage generating module is next to and electrically connected to the first high voltage generating module in the series connection, and the third high voltage generating module is next to and electrically connected to the second high voltage generating module in the series connection.

10. The high voltage generator of claim 9, wherein the first time point is later than the second time point, and the second time point is later than the third time point.

11. The high voltage generator of claim 9, wherein the first time point is earlier than the second time point, and the second time point is earlier than the third time point.

12. The high voltage generator of claim 1, wherein one of the multiple high voltage generating modules includes an inverter circuit, a high voltage generating unit, and a rectifier,
   the inverter circuit is configured to convert a direct voltage into an alternating voltage in response to receipt of a driving pulse;
   the high voltage generating unit is configured to increase the alternating voltage to obtain an increased alternating voltage; and
   the rectifier is configured to convert the increased alternating voltage into the voltage component.

13. The high voltage generator of claim 12, wherein the high voltage generating module further includes a resonant circuit configured to perform a filtering operation on the alternating voltage.

14. The high voltage generator of claim 12, further comprising one or more power modules configured to provide the direct voltage to the inverter circuit.

15. The high voltage generator of claim 1, wherein the total voltage is provided to an x-ray radiation source of an imaging device for energy imaging.

16. A system, comprising:

an x-ray radiation source configured to generate x-ray radiation rays, the x-ray radiation source including a high voltage generator and a tube, the high voltage generator including multiple high voltage generating modules and at least one driving module, wherein the multiple high voltage generating modules are configured to provide a total voltage to the tube for generating x-ray radiation rays, each of the multiple high voltage generating modules being configured to receive a driving pulse and generate a voltage component of the total voltage according to the driving pulse, and wherein the at least one driving module comprises:

- a signal conditioner configured to filter or limit electrical signals fed back by each of the multiple high voltage generating modules;
- a driving pulse generating unit configured to generate an initial driving pulse based on an electrical signal output by the signal conditioner and an operational constraint associated with a ripple wave included in the total voltage;
- a power amplifier configured to amplify the initial driving pulse; and
- a signal driving unit configured to transmit the amplified initial driving pulse to each of the multiple high voltage generating modules; and
- a detector configured to receive at least a portion of the x-ray radiation rays and generate imaging data, wherein the multiple high voltage generating modules are in a series connection, time points when the multiple high voltage generating modules receive driving pulses are different, and waveforms of the driving pulses are the same.

17. The system of claim 16, wherein differences between consecutive time points when two high voltage generating modules among the multiple high voltage generating modules receive driving pulses consecutively are the same or different.

18. The system of claim 16, wherein differences between time points when two adjacent high voltage generating modules among the multiple high voltage generating modules receive driving pulses are the same or different, the two adjacent high voltage generating modules are next to each other in the series connection and electrically connected.

19. The system of claim 16, wherein the multiple high voltage generating modules includes a first high voltage generating module, a second high voltage generating module, and a third high voltage generating module, the first high voltage generating module is configured to receive the driving pulse at a first time point, the second high voltage generating module is configured to receive the driving pulse at a second time point, the third high voltage generating module is configured to receive the driving pulse at a third time point, a difference between the first time point and the second time point is the same as or different from a difference between the second time point and the third time point.

20. A method implemented on a high voltage generator including multiple high voltage generating modules in a series connection configured to provide a total voltage to a tube of an x-ray radiation device for generating x-ray radiation rays and at least one driving module, comprising:

generating, by each of the at least one driving module, a driving pulse, wherein the at least one driving module comprises:

- a signal conditioner configured to filter or limit electrical signals fed back by each of the multiple high voltage generating modules;
- a driving pulse generating unit configured to generate an initial driving pulse based on an electrical signal output by the signal conditioner and an operational constraint associated with a ripple wave included in the total voltage;
- a power amplifier configured to amplify the initial driving pulse; and
- a signal driving unit configured to transmit the amplified initial driving pulse to each of the multiple high voltage generating modules;

transmitting the driving pulse to at least one of the multiple high voltage generating modules; and generating, by each of the multiple high voltage generating modules, a voltage component of the total voltage in response to receipt of the driving pulse, wherein time points when the multiple high voltage generating modules receive driving pulses are different, and waveforms of the driving pulses are the same.

* * * * *